(12) United States Patent
Kang et al.

(10) Patent No.: US 6,775,172 B2
(45) Date of Patent: Aug. 10, 2004

(54) NONVOLATILE FERROELECTRIC MEMORY AND METHOD FOR DRIVING THE SAME

(75) Inventors: Hee Bok Kang, Taejon-kwangyokshi (KR); Hun Woo Kye, Ichon-shi (KR); Geun Il Lee, Yong-in-shi (KR); Je Hoon Park, Songnam-shi (KR); Jung Hwan Kim, Seoul (KR)

(73) Assignee: Hynix Semiconductor Inc., KyoungKi-do (KR)

(*) Notice: Subject to any disclaimer, the term of this patent is extended or adjusted under 35 U.S.C. 154(b) by 120 days.

(21) Appl. No.: 10/233,399

(22) Filed: Sep. 4, 2002

(65) Prior Publication Data

US 2003/0053327 A1 Mar. 20, 2003

(30) Foreign Application Priority Data

Sep. 17, 2001 (KR) ........................................ 2001-57275

(51) Int. Cl.[7] .............................. G11C 11/12; G11C 7/00
(52) U.S. Cl. .................... 365/145; 365/198.11; 365/196
(58) Field of Search ................................. 365/145, 196, 365/189.11, 203, 65

(56) References Cited

U.S. PATENT DOCUMENTS

| 5,894,447 A | * | 4/1999 | Takashima ................. 365/158 |
| 6,072,711 A | | 6/2000 | Kang |
| 6,091,622 A | | 7/2000 | Kang |
| 6,091,623 A | | 7/2000 | Kang |
| 6,118,687 A | | 9/2000 | Kang |
| 6,118,695 A | | 9/2000 | Yoneyama |
| 6,128,213 A | | 10/2000 | Kang |

FOREIGN PATENT DOCUMENTS

| DE | 19915075 | 10/1999 |
| DE | 19923979 | 12/1999 |

* cited by examiner

Primary Examiner—Thong Q. Le
(74) Attorney, Agent, or Firm—Morgan, Lewis & Bockius LLP

(57) ABSTRACT

A nonvolatile ferroelectric memory includes a top cell array block and a bottom cell array block, each array block having sub cell array blocks, each sub cell array block having a plurality of unit cells; a plurality of main bitlines arranged in one direction in correspondence to a column unit of the sub cell array blocks; a plurality of sub bitlines each connected to one terminal of one of the plurality of unit cells arranged in a same direction as the one direction of the main bitlines; a sense amplifier block having sense amplifiers between the top cell array block and the bottom cell array block, each sense amplifier for amplifying a signal from the main bitline; sub bitline first switch signal application lines and sub bitline second switch signal application lines for controlling connection of the sub bitlines and the main bitlines, sub bitline pull up signal application lines for controlling pull up of the sub bitlines by a self boost operation, and sub bitline pull down signal application lines for selective pull down of the sub bitlines, which are arranged perpendicular to the sub bitlines in correspondence to the sub cell array blocks; a first switch device in each sub cell array block in correspondence to a column direction for operation under control of the sub bitline first switch signal application line; a second switch device in each sub cell array block in correspondence to a column direction for selective transfer of a signal from the sub bitline pull up signal application line to the sub bitline under the control of the sub line second switch signal application line; and, a third switch device in each sub cell array block in correspondence to a column direction for selective pull down of the sub bitline under control of the sub bitline pull down application line.

17 Claims, 22 Drawing Sheets

NONVOLATILE FERROELECTRIC MEMORY AND METHOD FOR DRIVING THE SAME

This application claims the benefit of the Korean Application No. P2001-57275 filed on Sep. 17, 2001, which is hereby incorporated by reference.

BACKGROUND OF THE INVENTION

1. Field of the Invention

The present invention relates to a nonvolatile ferroelectronic memory, and more particularly, to a nonvolatile ferroelectric memory, and a method for driving the nonvolatile ferroelectric memory.

2. Discussion of the Related Art

The ferroelectric memory, i.e., FRAM(Ferroelectric Random Access Memory) is paid attention as a next generation memory. In general, the FRAM has a data processing speed similar to that of a DRAM(Dynamic Random Access Memory), and is capable of conserving data even if the power is turned off. Also, the FRAM is similar to the DRAM in structure and includes a capacitor of a ferroelectric material for utilizing a high residual polarization of the ferroelectric material. The residual polarization permits the conservation of data even after removal of an electric field.

FIG. 1 illustrates a conventional characteristic curve of a hysteresis loop of a general ferroelectric material.

Referring to FIG. 1, in general, a polarization induced by an electric field is not erased totally, but a certain amount ('d' or 'a' state) of which is remained, even if the electric field is removed due to existence of the residual polarization(or spontaneous polarization). The 'd' and 'a' states correspond to '1' and '0' respectively in application to a memory.

FIG. 2 illustrates a unit cell of a conventional non-volatile ferroelectric memory.

Referring to FIG. 2, the unit cell of the conventional non-volatile ferroelectric memory includes a bitline B/L formed in one direction, a wordline W/L formed in a perpendicular direction to the bitline, a plateline P/L formed in a parallel direction with the wordline W/L, a transistor TI having a gate connected to the wordline W/L and a drain connected to the bitline B/L, and a ferroelectric capacitor FC1 having a first terminal connected to the drain of the transistor T1 and a second terminal connected to the plateline P/L.

The data input/output operation of the conventional non-volatile ferroelectric memory will be explained. FIG. 3A is a diagram illustrating timing of a write mode operation of the conventional ferroelectric memory, and FIG. 3B is a diagram illustrating timing of a read mode operation of the conventional ferroelectric memory.

In the write mode operation, when an external chip enable signal CSBpad transits from "high" to "low" and, on the same time, an external write enable signal WEBpad transits from "high" to "low," a write mode is started. When address decoding is started in the write mode, a pulse to be applied to the wordline W/L transits from 'low' to 'high' to select the unit cell. Thus, in a period during which the wordline W/L is held 'high', the plateline P/L has a 'high' signal applied thereto for one period and a 'low' signal applied thereto for another period in succession. In order to write a logical value '1' or '0' on the selected cell, a 'high' or 'low' signal synchronized to the write enable signal WEBpad is applied to the bitline B/L. That is, if a 'high' signal is applied to the bitline B/L, and a signal applied to the plateline P/L is 'low' in a period during which a signal applied to the wordline W/L is in a 'high' state, a logical value '1' is then written on the ferroelectric capacitor FC1. If a 'low' signal is applied to the bitline B/L, and a signal applied to the plateline P/L is 'high', a logical value '0' is then written on the ferroelectric capacitor FC1.

Next, the read mode operation of reading the data stored in the unit cell will be explained.

If the chip enable signal CSBpad transits from 'high' to 'low' externally, all bitlines B/L are equalized to a 'low' voltage by an equalizer signal before the wordline W/L is selected. Then, after the bitlines B/L are disabled, an address is decoded, and the decoded address transits the wordline W/L from 'low' to 'high', to select the unit cell. A 'high' signal is applied to the plateline P/L of the selected cell, to break a data Qs corresponding to a logical value '1' stored in the ferroelectric memory.

If a logical value '0' is in storage in the ferroelectric memory, a data corresponding to the logical value '0' is not broken. The non-broken data and the broken data thus provide values different from each other according to the aforementioned hysteresis loop, such that a sense amplifier senses a logical value '1' or '0'.

That is, in the hysteresis loop of FIG. 1, that the data is broken is a case where the value is changed from 'd' to 'f', and that the data is not broken is a case where the value is changed from 'a' to 'f'. Therefore, if the sense amplifier is enabled after a certain time period is passed, in the case where the data is broken, the logical value '1' is provided as amplified, and in the case where the data is not broken, the logical value '0' is provided as amplified.

After the sense amplifier amplifies data, since an original data should be restored, the plateline P/L is disabled from 'high' to 'low' in a state a 'high' signal is applied to the wordline W/L.

A conventional nonvolatile ferroelectric memory cell array having sub bitlines and main bitlines will be explained.

Though not shown in the drawing, the conventional nonvolatile ferroelectric memory cell array is provided with a plurality of main bitlines crossing sub cell array blocks. The sub cell array block has sub bitline therein in correspondence to the main bitline. There is a switching device SW1, SW2, - - -, or SWn between the sub bitline and the main bitline for electrical connection.

FIG. 4 illustrates one conventional sub cell array block in detail.

Referring to FIG. 4, the sub cell array block has cells arranged in a plurality of rows and columns. Also, there are a plurality of wordline pairs each having a wordline WL and a plateline PL arranged, repeatedly. There are a plurality of main bitlines in a direction crossing the wordline paris WL<0>, PL<0>, - - -, WL<63>, PL<63>. The drawing shows an example in which 64 rows are provided. Each cell is arranged at every two columns in a row, and each cell is arranged at every two rows in a column. Therefore, once one of the wordlines and one of the platelines are enabled, only cells connected either to odd numbered sub bitline, or even numbered sub bitline are selected. Such a cell array is called as a folded bitline cell array, in which no cells overlap when the cell array is folded centered on the main bitline, when a unit cell is provided among the wordline WL, the plateline PL, and the sub bitline, and the switching device SW1, or SW2, - - - is provided at an end of the sub bitline for controlling connection between the sub bitline and the main bitline. The unit cell includes one transistor and one ferroelectric capacitor, wherein the transistor has a gate connected to a wordline, and the ferroelectric capacitor has one terminal connected to a drain (or source) of the transistor, and the other terminal connected to a plateline.

Structures of the ferroelectric capacitor, the sub bitline, and the main bitline in the foregoing nonvolatile ferroelectric memory cell array will be explained, briefly.

FIG. 5 illustrates a section of a structure of the unit cell in FIG. 4.

Referring to FIG. 5, the unit nonvolatile ferroelectric memory cell includes a gate electrode 252 in one region of a silicon substrate 251, a source 253a and a drain 253b in the silicon substrate 251 on both sides of the gate electrode 252, a sub bitline 258 in one direction brought into contact through the drain 253b, a contact plug 256, and a contact pad 257. The numerals 254 and 255 denote first and second interlayer insulating films, respectively. There is a third interlayer insulating film 259 deposited on the sub bitline 258, and a capacitor contact plug 260 in a contact hole formed through the first to third interlayer insulating films 254, 255, and 259 and the sub bitline 258 to expose the source 253a. There is a fixed pattern of a stack of a lower electrode 261 of the capacitor, a ferroelectric film 262, and an upper electrode 263 of the capacitor in contact with the capacitor contact plug 260. There is a main bitline 269 isolated from the ferroelectric capacitor designed to be connected to the sub bitline under the control of the switching device (not shown in the drawing) over the ferroelectric capacitor. Thus, the sub bitline is arranged below the ferroelectric capacitor and the main bitline is arranged over the ferroelectric capacitor.

The foregoing related art nonvolatile ferroelectric memory cell array has the following problems.

There is a limitation in a stable operation of the cell with the ferroelectric capacitor at a low voltage.

Moreover, because both the writing of a logical value "1" and a logical value "0" are carried out in the pre-charge time period, there is a limitation in reducing the pre-charge time period.

SUMMARY OF THE INVENTION

Accordingly, the present invention is directed to a nonvolatile ferroelectric memory, and a method for driving the same that substantially obviates one or more of the problems due to limitations and disadvantages of the related art.

An object of the present invention is to provide a nonvolatile ferroelectric memory which can improve a chip operation speed.

Another object of the present invention is to provide a ferroelectric memory applicable to a chip which is operable even at a low voltage.

A further object of the present invention is to provide a method for driving a nonvolatile ferroelectric memory, which can reduce a pre-charge time period.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a nonvolatile ferroelectric memory includes a top cell array block and a bottom cell array block, each array block having sub cell array blocks, each sub cell array block having a plurality of unit cells; a plurality of main bitlines arranged in one direction in correspondence to a column unit of the sub cell array blocks; a plurality of sub bitlines each connected to one terminal of one of the plurality of unit cells arranged in a same direction as the one direction of the main bitlines; a sense amplifier block having sense amplifiers between the top cell array block and the bottom cell array block, each sense amplifier for amplifying a signal from the main bitline; sub bitline first switch signal application lines and sub bitline second switch signal application lines for controlling connection of the sub bitlines and the main bitlines, sub bitline pull up signal application lines for controlling pull up of the sub bitlines by a self boost operation, and sub bitline pull down signal application lines for selective pull down of the sub bitlines, which are arranged perpendicular to the sub bitlines in correspondence to the sub cell array blocks; a first switch device in each sub cell array block in correspondence to a column direction for operation under control of the sub bitline first switch signal application line; a second switch device in each sub cell array block in correspondence to a column direction for selective transfer of a signal from the sub bitline pull up signal application line to the sub bitline under the control of the sub line second switch signal application line; and, a third switch device in each sub cell array block in correspondence to a column direction for selective pull down of the sub bitline under control of the sub bitline pull down application line.

In another aspect of the present invention, there is provided a method for driving a nonvolatile ferroelectric memory, in which a sub bitline is enabled, and pulled up/pulled down by a self boost operation, the sub bitline being selected by a sub bitline first switching signal application line, a sub bitline second switching signal application line, a sub bitline pull up signal application line, and a sub bitline pull down signal application line, and when a continuous active period is divided into t1, t2, t3, t4, and t5 sections, and a pre-charge period is divided into t0, and t6 sections, the method comprising the steps of: (a) applying a first high level voltage to the sub bitline pull down signal application line in the t0 section, for pulling down a sub bitline and a main bitline to a low level; (b) applying a low level voltage to the sub bitline pull down signal application line in the t1 section; (c) applying a second high level voltage higher than the first high level voltage to a wordline in the t2, t3, and t4 sections, and to a plateline in the t2, and t3 sections, and applying the first high level voltage to the sub bitline first switch signal application line in the t2, and t3 sections, for transferring cell data to the sense amplifier through the sub bitline and the main bitline; (d) applying the second high level voltage to the sub bitline second switch signal application line, and transiting the plateline to the low level, both in the t4 section, and applying the second high level voltage to the sub bitline second switch signal application line in the t5 section, for self boosting the sub bitline second switch signal application line and the word line to a third high level voltage higher than the second high level voltage, thereby writing logic "1" data on a ferroelectric capacitor; and, (e) transiting the wordline and the plateline to the second high level, and applying the first high level voltage to the sub bitline first switch application line, both in the t6 section, for writing logic "0" data in the ferroelectric capacitor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Reference will now be made in detail to the preferred embodiments of the present invention, examples of which are illustrated in the accompanying drawings.

If a bitline resistance and a bitline capacitance are large in the ferroelectric memory, a Cb/Cs (Cb denotes the bitline capacitance, and Cs denotes a cell charge) ratio becomes greater, thus requiring a large sized cell array. Here, a chip size becomes greater due to a poor cell array efficiency.

The present invention aims to prevent the chip size from becoming greater by securing a stable Cb/Cs and improving a chip operation speed. The present invention also aims to permit a low voltage operation at a voltage lower than 1.0V by using a high voltage in the cell in a low voltage operation mode by using a "high" voltage on a BLPU signal application line boosted higher than a VCC. The present invention also teaches writing a logic "1" data or logic "0" data in an active period for reducing a pre-charge time in a write operation.

There are a hierarchal folded bitline and a hierarchal open bitline in the cell arrays of the present invention provided for achieving the foregoing objects of the present invention, and sorted according to bitline and cell arrangements, of which overall cell arrays will be explained.

The hierarchal folded bitline cell array is a cell array in which cells connected to the bitlines and the wordlines are not overlapped when the cell array is folded centered on a bitline. The hierarchal open bitline cell array is a cell array in which cells connected to the bitlines and the wordlines are overlapped when the cell array is folded centered on the bitline.

The cell array in accordance with a first preferred embodiment of the present invention of the hierarchal folded bitline cell array will be explained in reference to FIG. 6.

Figure 1:
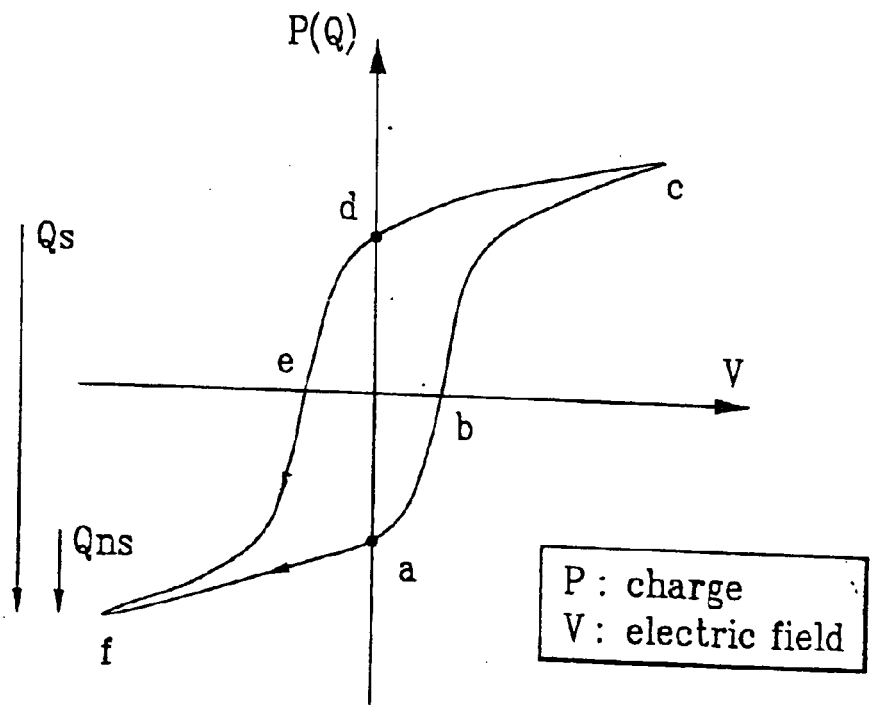
FIG. 1 illustrates a characteristic curve of a hysteresis loop of a general ferroelectric material.
Figure 2:
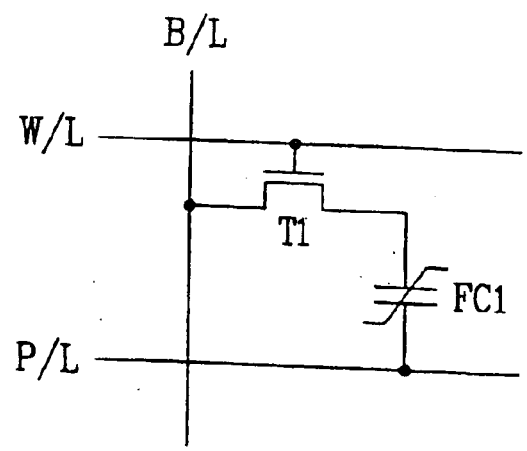
FIG. 2 illustrates a unit cell of the related art non-volatile ferroelectric memory.
Figure 3A:
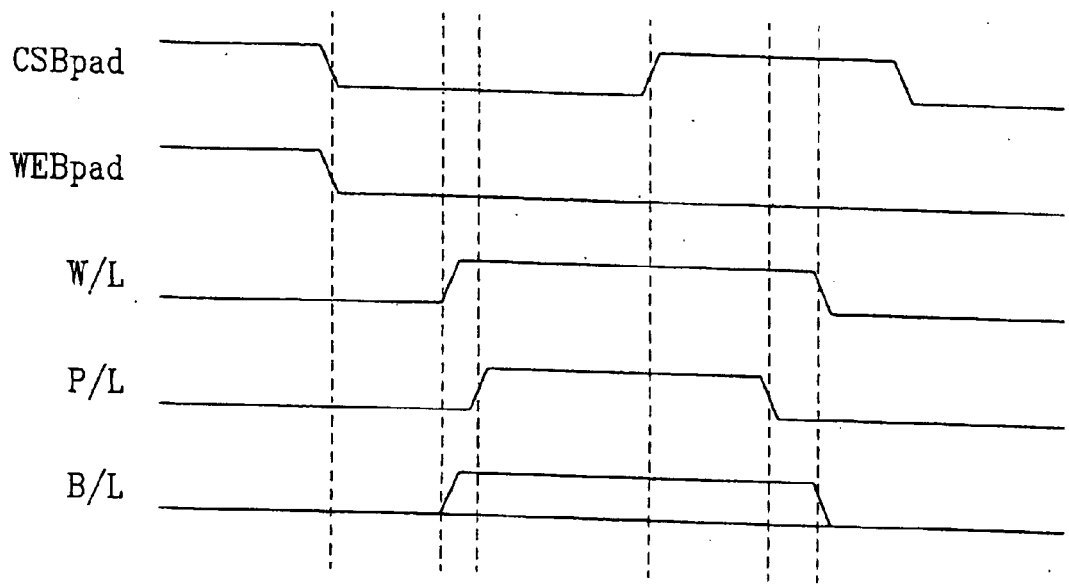
FIG. 3A illustrates a timing diagram of a write mode operation of the related art ferroelectric memory.
Figure 3B:
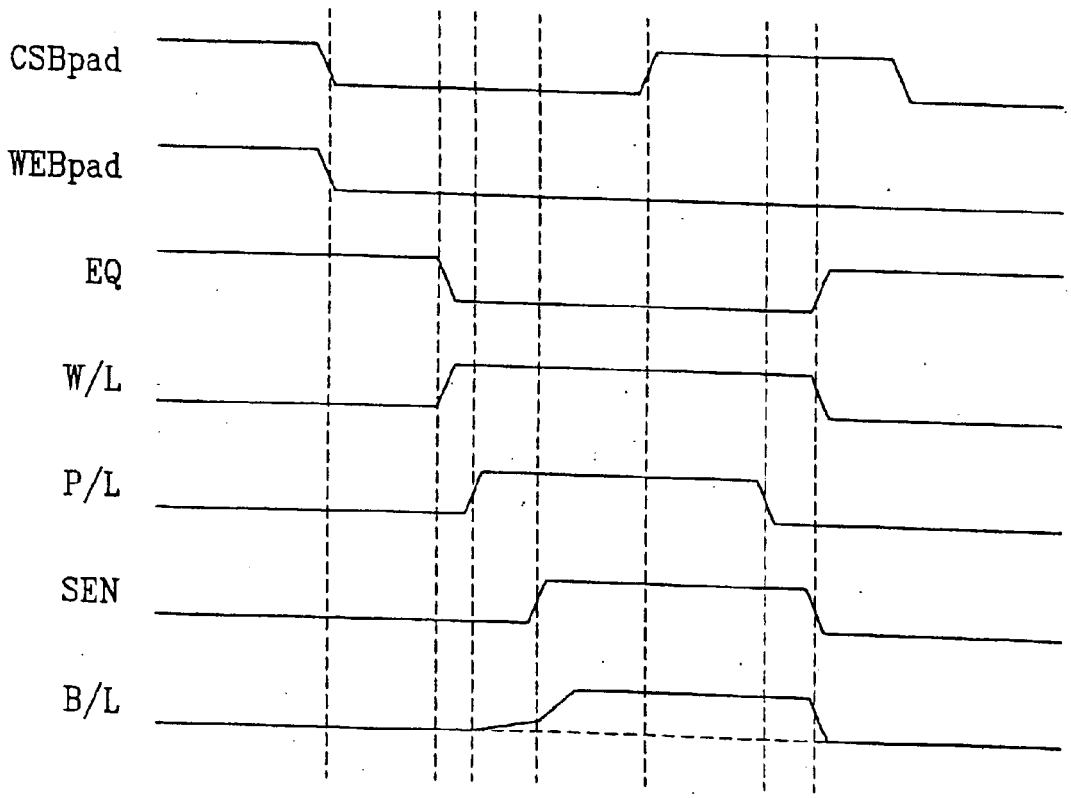
FIG. 3B illustrates a timing diagram of a read mode operation of the related art ferroelectric memory.
Figure 4:
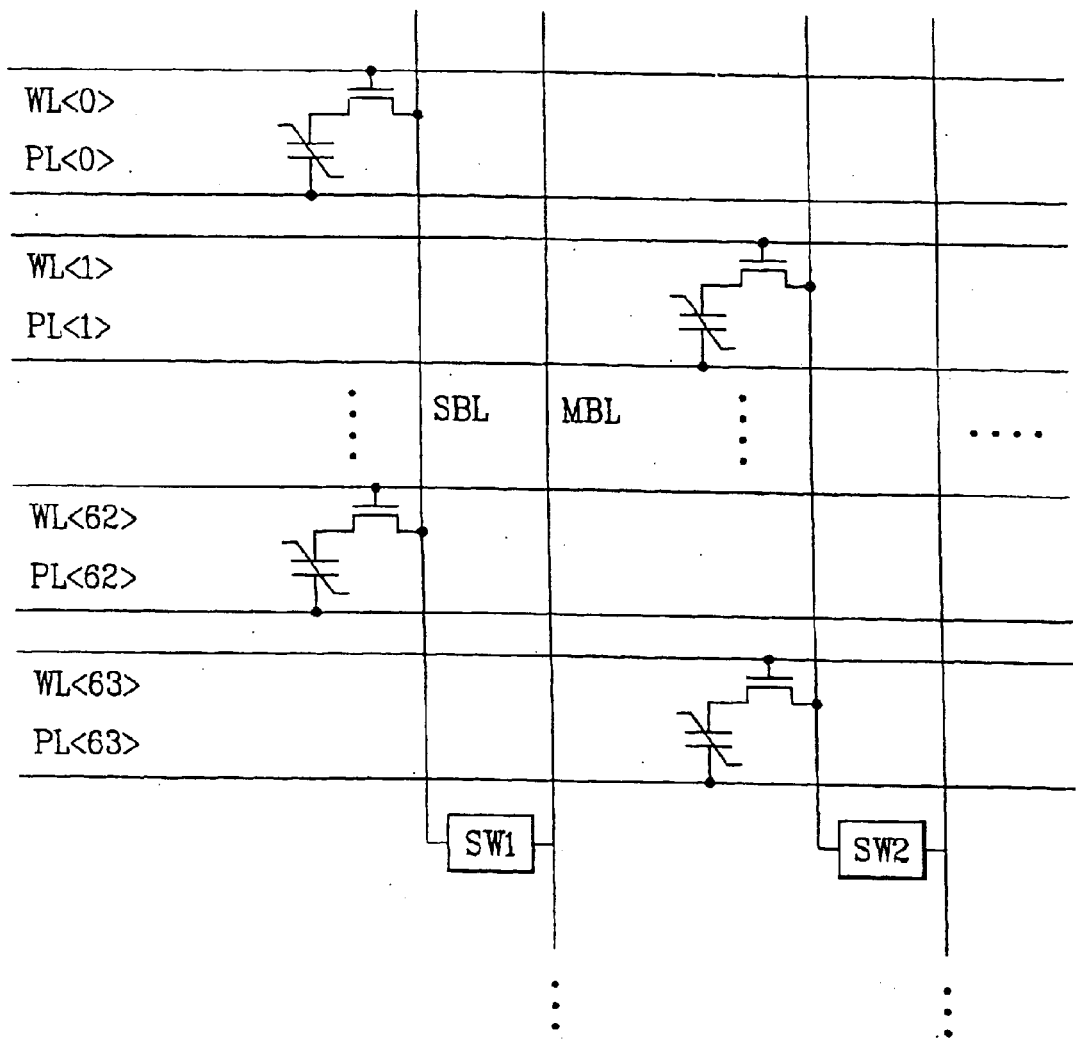
FIG. 4 illustrates a circuit of a folded bitline structured sub cell array block.
Figure 5:
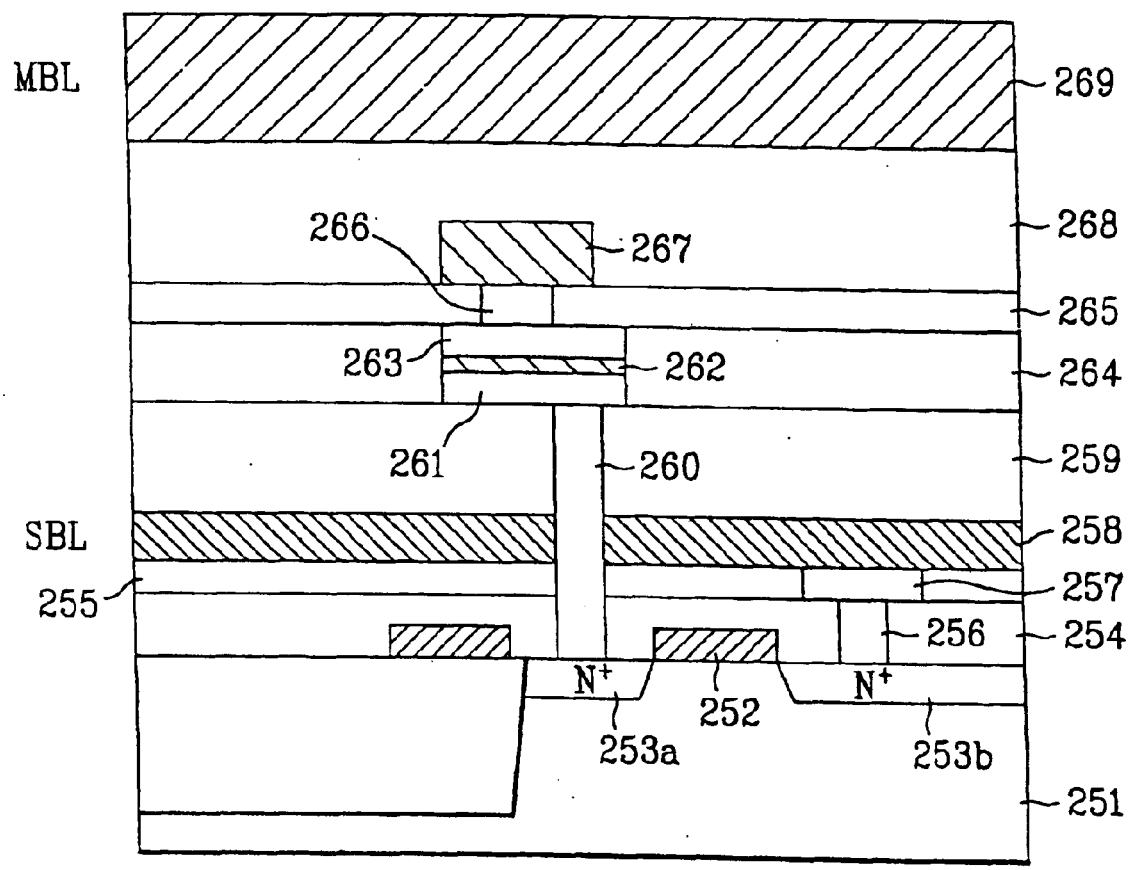
FIG. 5 illustrates a section of a structure of the unit cell in FIG. 4.
Figure 6:
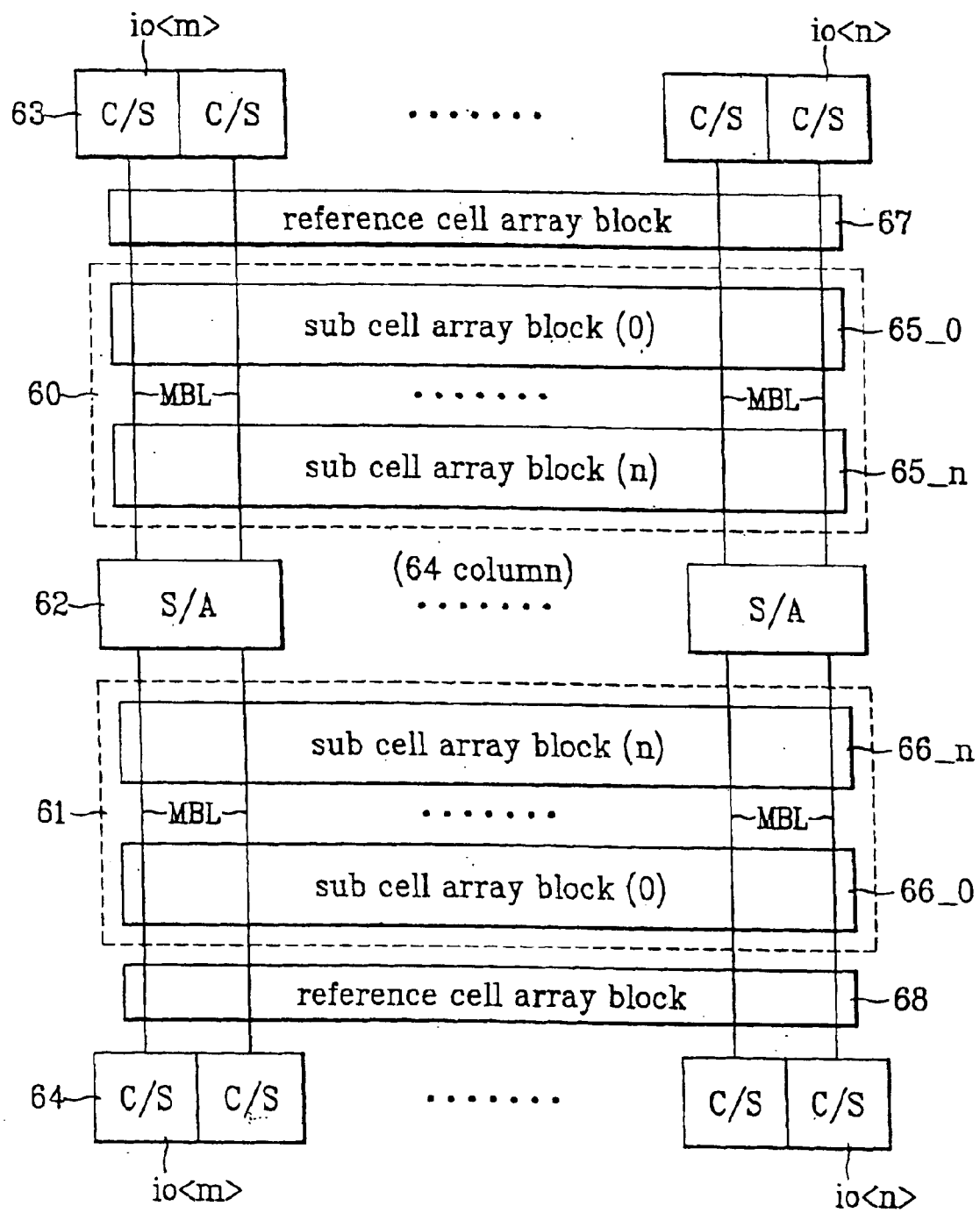
FIG. 6 illustrates a nonvolatile ferroelectric memory array in accordance with a first preferred embodiment of the present invention.

FIG. 6 shows a nonvolatile ferroelectric memory array in accordance with a first preferred embodiment of the present invention.

Referring to FIG. 6, the cell array includes a top cell array block 60, a bottom cell array block 61, and a plurality of sense amplifiers 62 each arranged between the top and bottom cell array blocks 60 and 61 and each connected to two bitlines, wherein the bitline denotes the main bitline, and there are sub bitlines included further in correspondence to one main bitline, though not shown in FIG. 6.

Also, though not shown in FIG. 6, there are switching control blocks 71 and 72 further provided in the cell array of the present invention, for controlling connection between the main bitline and the sub bitlines, and controlling a voltage transmitted to the ferroelectric capacitor in each cell.

There are a plurality of column switch blocks 63 and 64 at each end of the bitlines connected to a data bus io<m>, - - - , or io<n>. Though not shown in the drawing, the data buses io<m>, - - - , io<n> of the top cell array block 60 and the bottom cell array block 61 are connected to a main amplifier at one end of the entire cell array block.

The top or bottom cell array block 60 or 61 has a plurality of sub cell array blocks ($65\_0$~$65\_{13}$ n) or ($66\_0$~$66\_n$). There are reference cell array blocks 67 and 68 in correspondence to the top and bottom cell array blocks 60 and 61. The reference cell array block 67 is arranged between the top cell array block 60 and the plurality of column switch blocks 63 corresponding to the top cell array block 60. The reference cell array block 68 is arranged between the bottom cell array block 61 and the plurality of column switch blocks 64 corresponding to the bottom cell array block 61.

Figure 7:
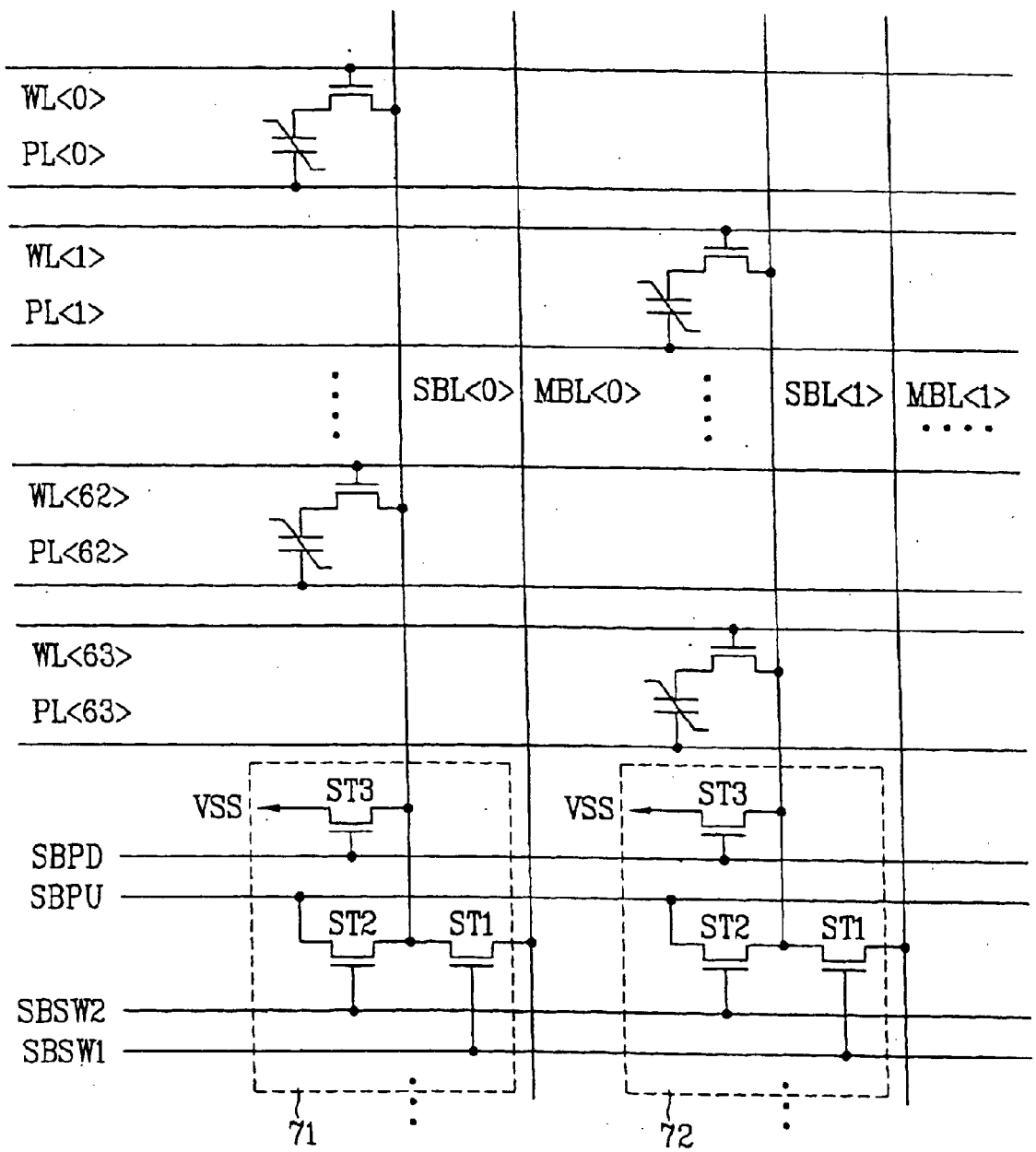
FIG. 7 illustrates a detailed circuit of the sub cell array block in FIG. 6.

A detailed explanation of a unit sub cell array block in a plurality of sub cell array blocks of the hierarchal folded bitline will be given below in reference to FIGS. 6 and 7. FIG. 7 shows a detailed circuit of the sub cell array block in FIG. 6.

As shown in FIGS. 6 and 7, there are a plurality of main bitlines MBL<0>, MBL<1>, - - - , MBL<n> arranged in one direction, and a plurality of sub bitlines SBL<0>, SBL<1>, - - - , SBL<n> arranged in a parallel direction with the main bitlines MBL<0>, MBL<1>, - - - , MBL<n> such that the sub bitlines SBL<0>, SBL<1>, - - - , SBL<n> are connected to the unit cells in respective sub cell arrays. Also, there are pairs of wordline/plateline (W/L<0>, P/L<0>), - - - , (W/L<n>, P/L<n>) arranged to cross the main bitlines MBL<0>, MBL<1>, - - - , MBL<n>.

FIG. 6 illustrates a case in which each sub cell array includes 64 rows and 64 columns, wherein the sub cell array block has a plurality of cells between the plurality of rows and columns. Each cell is arranged at every two columns in a row, and is also arranged at every two rows in a column. Therefore, once one of the wordlines and one of the platelines are enabled, only cells connected either to odd numbered sub bitline or even numbered sub bitline are selected, and the even numbered/odd numbered bitlines which are not selected are used as reference lines.

Also, there are a sub bitline pull down (SBPD) signal application line, first and second bitline switch SBSW1, and SBSW2 signal application lines, and a sub bitline pull up SBPU signal application line arranged in a parallel direction with the pairs of wordline/plateline (W/L<0>, P/L<0>), - - -, (W/L<n>, P/L<n>).

There are switching control blocks 71, 72, - - - , under the control of the SBPD, SBSW1, SBSW2, and SBPU application lines, each formed in correspondence to one main bitline and one sub bitline, for controlling connection of a selected cell either to the main bitline or to the sub bitline, and controlling a voltage applied to the ferroelectric capacitor in the selected cell.

The switching control block 71 includes first, second, and third switching transistors ST1, ST2, and ST3. The first switching transistor ST1 includes a gate connected to the SBW1 application line, and two electrodes one of which is connected to the main bitline and the other of which is connected to the bitline. The second switching transistor ST2 includes a gate connected to the SBW2 application line, and two electrodes one of which is connected to the sub bitline and the other of which is connected to the SBPU application line. The third switching transistor ST3 includes a gate connected to the SBPD application line, and two electrodes one of which is connected to the sub bitline and the other of which is connected to a ground voltage terminal VSS.

A cell array in accordance with a second preferred embodiment of the present invention will be explained in reference to FIG. 8. The second embodiment cell array of the present invention is hierarchal open bitline cell array.

Figure 8:
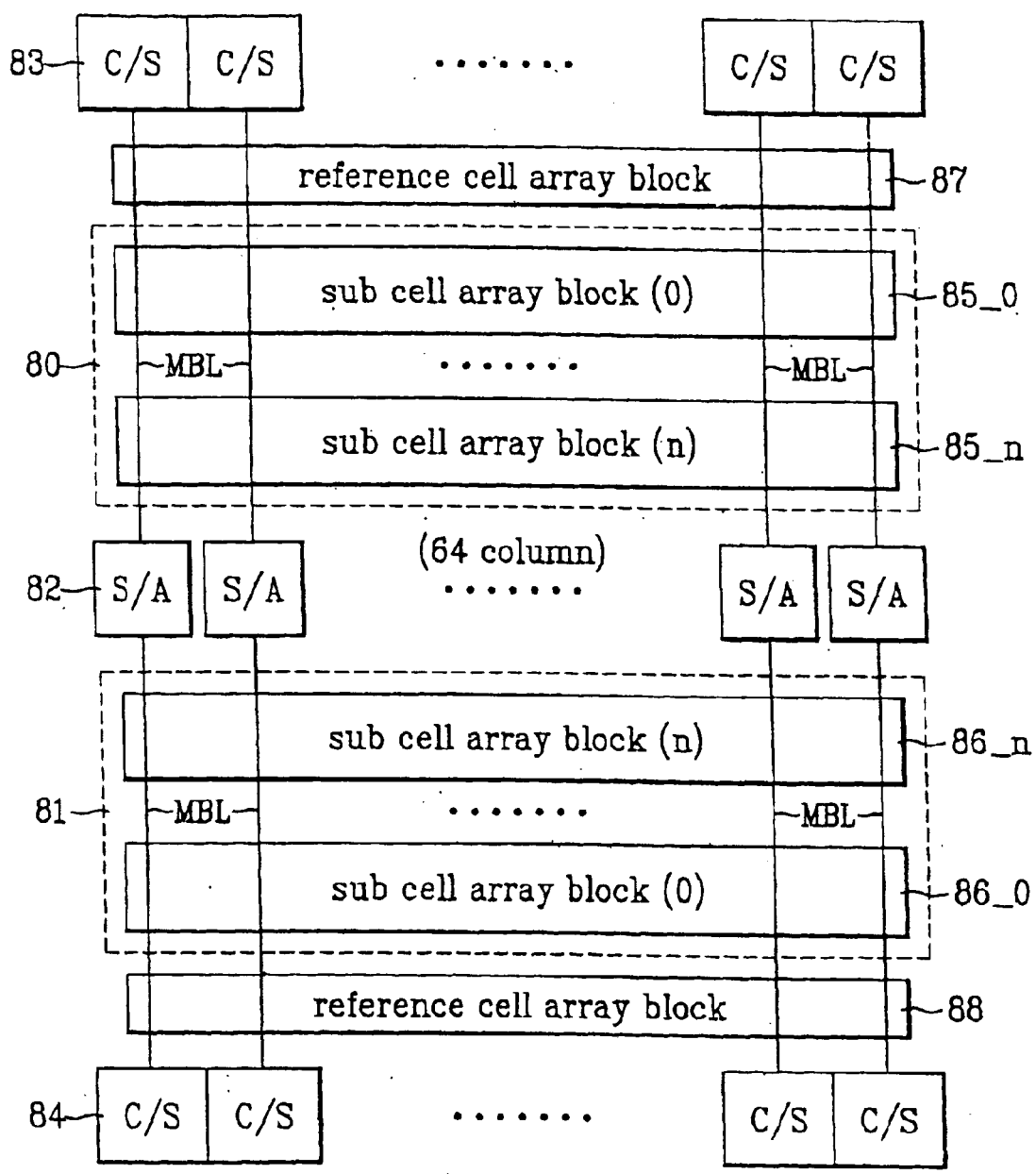
FIG. 8 illustrates a nonvolatile ferroelectric memory array in accordance with a second preferred embodiment of the present invention.

As shown in FIG. 8, the second embodiment cell array of the present invention includes a top cell array block 80, a bottom cell array block 81, and a plurality of sense amplifiers 82 arranged between the top and bottom cell array blocks 80 and 81 and each connected to one of bitlines. There are a plurality of column switch blocks 83 or 84 each connected to an end of one of bitline and also to a data bus io<m>, - - - , io<n> (not shown in the drawing). Though not shown in the drawing, the data buses io<m>, - - -, io<n> of the top cell array block 80 and the bottom cell array block 81 are connected to a main amplifier at one end of entire cell array block.

The top or bottom cell array block 80 or 81 has a plurality of sub cell array blocks (85_0~85_n) or (86_0~86_n). There are reference cell array blocks 87 and 88 in correspondence to the top and bottom cell array blocks 80 and 81. The reference cell array block 87 is arranged between the top cell array block 80 and the plurality of column switch blocks 83 corresponding to the top cell array block 80. The reference cell array block 88 is arranged between the bottom cell array block 81 and the plurality of column switch blocks 84 corresponding to the bottom cell array block 81.

Figure 9:
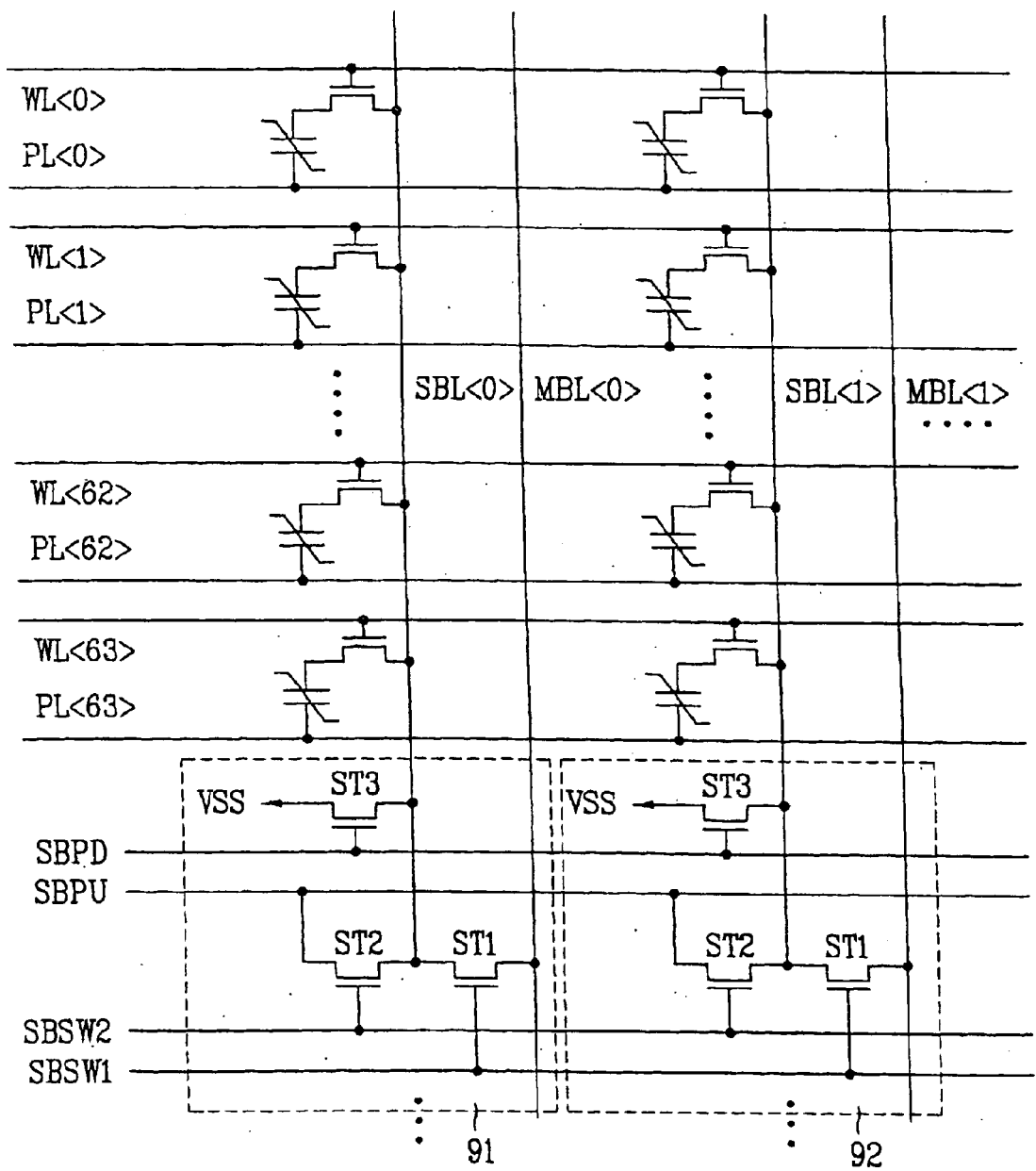
FIG. 9 illustrates a detailed circuit of the sub cell array block in FIG. 8.

A detailed explanation of a unit sub cell array block in the foregoing plurality of sub cell array blocks will be given below in reference to FIGS. 8 and 9. FIG. 9 illustrates a detailed circuit of the sub cell array block shown in FIG. 8.

Referring to FIGS. 8 and 9, there are a plurality of main bitlines MBL<0>, MBL<1>, - - -, MBL<n> arranged in one direction, and a plurality of sub bitlines SBL<0>, SBL<1>, - - -, SBL<n> arranged in a parallel direction with the main bitlines MBL<0>, MBL<1>, - - -, MBL<n> such that the sub bitlines SBL<0>, SBL<1>, - - -, SBL<n> are connected to the unit cells in respective sub cell arrays. Also, there are pairs of wordline/plateline (W/L<0>, P/L<0>), - - -, (W/L<n>, P/L<n>) arranged to cross the main bitlines MBL<0>, MBL<1>, - - -, MBL<n> and the sub bitlines SBL<0>, SBL<1>, - - -, SBL<n>.

FIG. 8 illustrates a case in which each sub cell array includes 64 rows and 64 columns, wherein the sub cell array block has a plurality of cells between the plurality of rows and columns. Each cell is arranged at every one column in a row, and is also arranged at every one row in a column.

Also, there are a sub bitline pull down (SBPD) signal application line, first and second bitline switch SBSW1, and SBSW2 signal application lines, and a sub bitline pull up SBPU signal application line, arranged in a parallel direction with the pairs of wordline/plateline (W/L<0>, P/L<0>), - - -, (W/L<n>, P/L<n>).

There are switching control blocks 91, 92, - - - , under the control of the SBPD, SBSW1, SBSW2, and SBPU application lines, each formed in correspondence to one main bitline and one sub bitline, for controlling connection of a selected cell either to the main bitline or to the sub bitline, and controlling a voltage applied to the ferroelectric capacitor in the selected cell.

The switching control block has first, second, and third switching transistors ST1, ST2, and ST3. The first switching transistor ST1 includes a gate connected to the SBW1 application line, and two electrodes one of which is connected to the main bitline and the other of which is connected to the sub bitline. The second switching transistor ST2 includes a gate connected to the SBW2 application line, and two electrodes one of which is connected to the sub bitline and the other of which is connected to the SBPU application line. The third switching transistor ST3 includes a gate connected to the SBPD application line, and two electrodes one of which is connected to the sub bitline and the other of which is connected to a ground voltage terminal VSS.

Of the plurality of sub bitlines SBL, one of the sub bitlines SBL is designed to be connected selectively in one time of operation of the nonvolatile ferroelectric memory. That is, of the SBSW1 signals for selecting any one of the plurality of sub bitlines SBL, only one is enabled, to select one of the sub bitlines SBL, which permits to reduce the load on the bitlines to a load level of one bitline.

The foregoing second embodiment cell array of the open bit line type has the same system with the first embodiment except that one sense amplifier is provided on one main bitline, and one cell in each cell array block is provided at a crossing point of the pairs of the wordline and the plateline and the sub bitline as shown in FIGS. 8 and 9.

Figure 10:
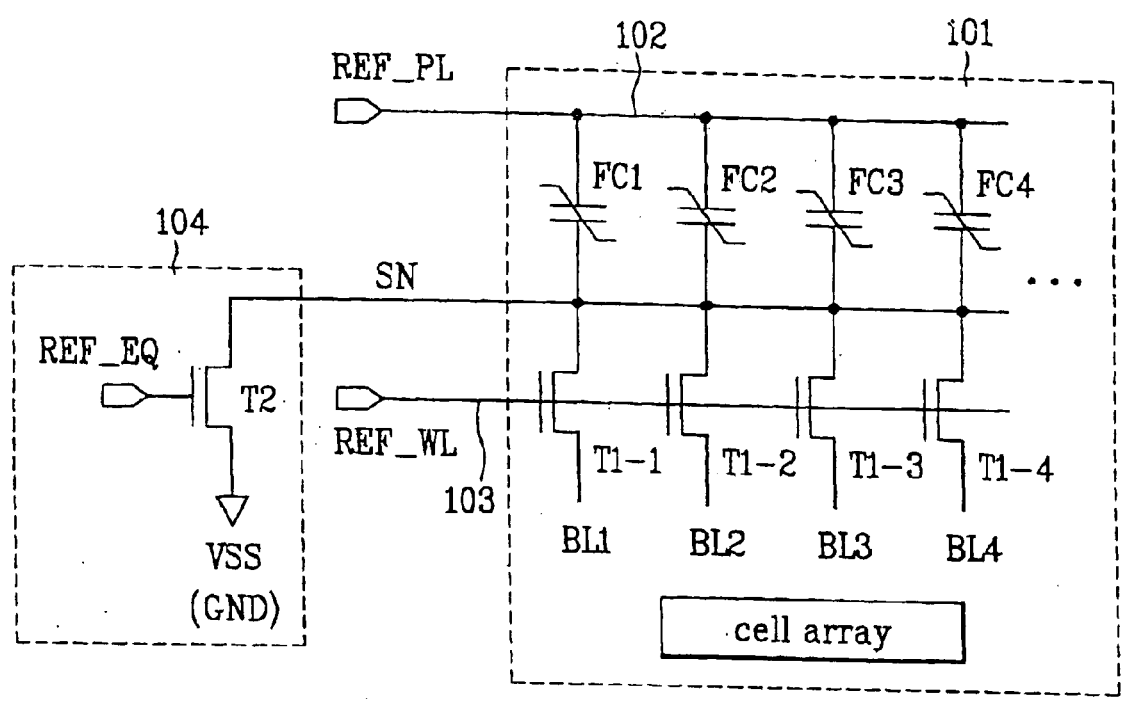
FIG. 10 illustrates a detailed circuit of the reference cell array block in FIG. 6 or FIG. 8.

FIG. 10 illustrates a detailed circuit of the reference cell array block shown in FIG. 6 or FIG. 8.

Referring to FIG. 10, the reference cell array block in the first, or second embodiment cell array includes a plurality of bitlines BL1, BL2, BL3, - - -, BLn arranged in one direction in a unit cell block 101, one reference wordline REF_WlL 103 arranged perpendicular to the bitlines, a reference plateline REF_P/L 102 arranged in a parallel direction with the reference wordline REF_W/L 103, a plurality of reference capacitors FC1, FC2, FC3, - - - , FCn arranged in parallel to one another each including a first electrode connected the reference plateline REF_P/L 102 and a second electrode connected to a storage node SN of the reference cell, a level initializing part 104 of an NMOS transistor T2 including a gate with a reference cell equalizing control signal REF_EQ applied thereto and two electrodes one of which is connected to a ground terminal GND and the other of which is connected to a storage node SN, and a switching block having a plurality of NMOS transistors T1-1, T1-2, T1-3, - - - , T1-n each including two electrodes one of which is connected to one of the bitlines and the other of which is connected to the storage node SN in the reference capacitor and a gate connected to the reference wordline REF_W/L in common.

Though not shown in the drawing, the ferroelectric memory of a hierarchal folded bitline structure or a hierarchal open bitline structure of the present invention may further include a wordline driver between the sub cell array blocks and the adjacent sub cell array blocks.

Figure 11:
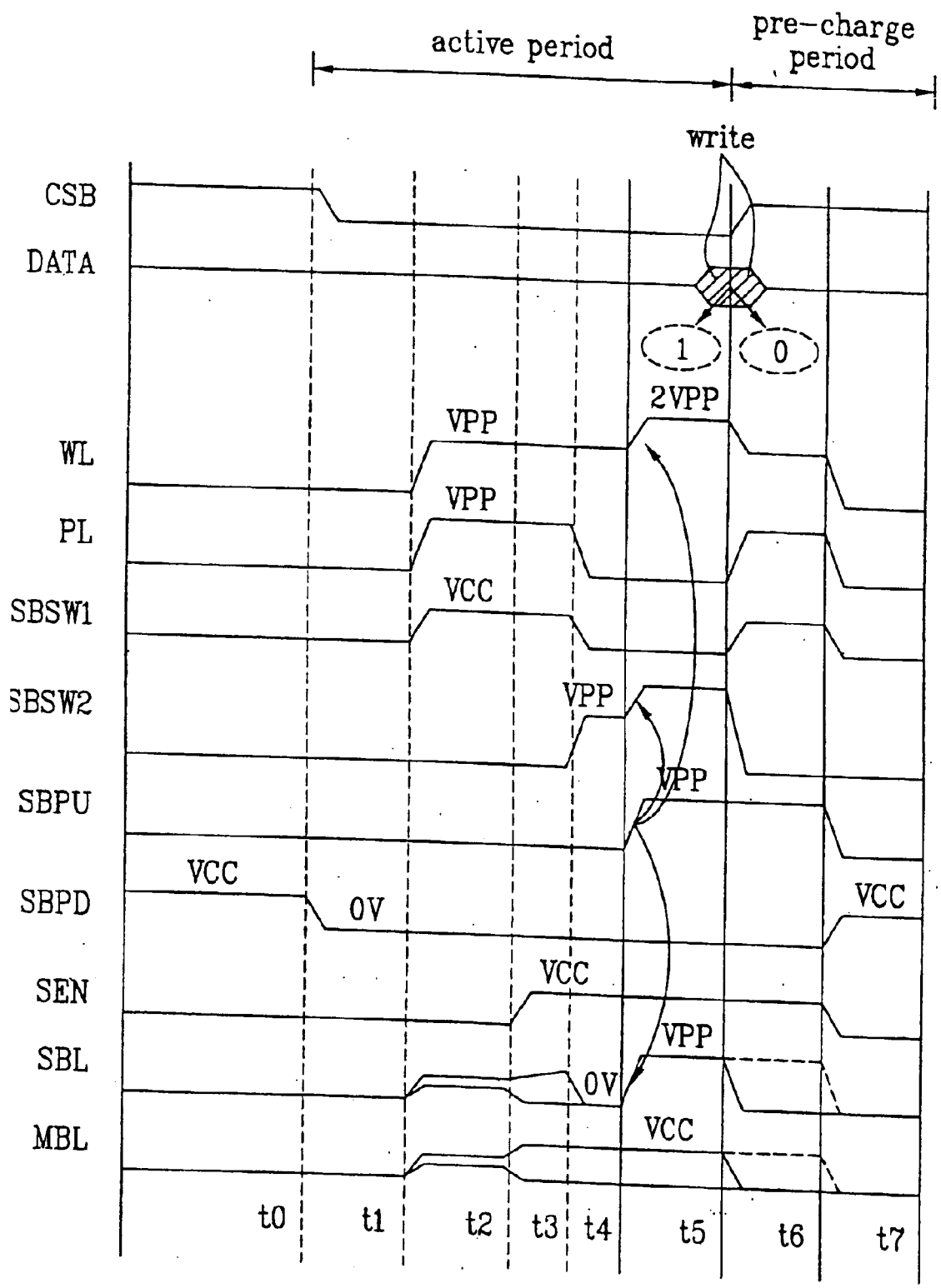
FIG. 11 illustrates an operation timing diagram of the present invention.

The operation of the foregoing ferroelectric memory of the present invention will be explained in reference to FIG. 11.

One cycle of cell operation has an active period and a pre-charge period, wherein the active period is when the chip selection signal is at a "low" level, and the pre-charge period is when the chip selection signal is at a "high" level.

In general, though a logical value "0", and "1" is written during the pre-charge period, the present invention suggests writing the logical value "0", or "1" in the active period, for reducing the pre-charge time period.

As the ferroelectric capacitor is stable when a circuit voltage is 2V more than when the circuit voltage is 1V, the present invention suggests making the circuit voltage provided to the ferroelectric capacitor to be 2V even if an external voltage applied thereto is 1V, for reducing power consumption by making the ferroelectric capacitor operative in a stable state even at a low voltage.

The operation of the present invention will be explained, in which the logical value '1' is written in the active period, and the logical value '0' is written in the pre-charge period. Entire operation timing will be explained with the operation timing divided into t0~t7, wherein t0, t6, and t7 sections are the pre-charge periods, and the t1~t7 sections are continuous active sections.

In the t0 section which is the pre-charge period before the active period, "VCC" is applied to the sub bitline pull down SBPD application line for making a voltage on the sub bitline SBL and the main bitline MBL to be 0V, and the "0V" is applied to the wordline WL, the plateline PL, the sub bitline first, and second switch signals SBSW1, and SBSW2, the sub bitline pull up signal SBPU application line, and the sense amplifier enable signal SEN application line.

Then, in the t1 section which is a section where the active period starts, "0" voltage is applied to the CSB application line and the SBPD application line.

In the t2 section, a VPP voltage is applied to the WL and the PL, and VCC is applied to the SBSW1 application line. The VPP has a value of 2VCC, and as the VCC is applied to the SBSW1, the SBL and the MBL are connected to each other to permit a data in the cell to be transmitted to the sense amplifier through the SBL and the MBL.

In the t3 section, the WL and the PL are maintained at "VPP" and the SBSW1 application line is maintained at "VCC", to provide "VCC" to the SEN to put the sense amplifier into operation, and "VCC" is applied to the SBSW1 application line to provide a signal of a "VCC" level to the SBL and the MBL.

In the t4 section, the WL is maintained at "VPP", the PL is transited from "VPP" to "0V", the SBSW1 is also transited from "VCC" to "0V", and the SBSW2 is transited from "0V" to "VPP". The SBSW2 is transited to "VPP" in the t4 section in advance, for self boosting the wordline WL and the SBSW2 to 2VPP in the t5 section of the active period, to write logic "1" data in the ferroelectric capacitor.

In the t5 section which is a section for writing logic "1" data in the active period, if the SBPU is transited to "VPP" when the SBSW2 is at "VPP", SBPU is at "0V", and the SBL is floated, the SBL is transited to "VPP", and the SBSW2 and the WL are self boosted to 2VPP, according to which the ferroelectric capacitor of the selected cell received the "VPP" signal is provided with "VPP".

In the t6 section which is a section the pre-charge starts, the logic "0" data is written, when the WL and the PL are maintained at "VPP", the SBSW1 is maintained at "VCC", the SBSW2 and the SBPD are maintained at "0V", and the SBPU is maintained at "VPP". In response to the foregoing signals, the first switch transistor ST1 is turned on, and the data (VPP) of logic "0" in storage in the sense amplifier is transferred to the ferroelectric capacitor of the cell through the SBL.

In the t7 section, alike the t0 section, a state before the active operation is maintained.

Thus, of the logic "1" and "0" data write operation which has been carried out in the pre-charge period, because the logic "1" data write operation is carried out in the active period, the pre-charge time period can be reduced.

Figure 12:
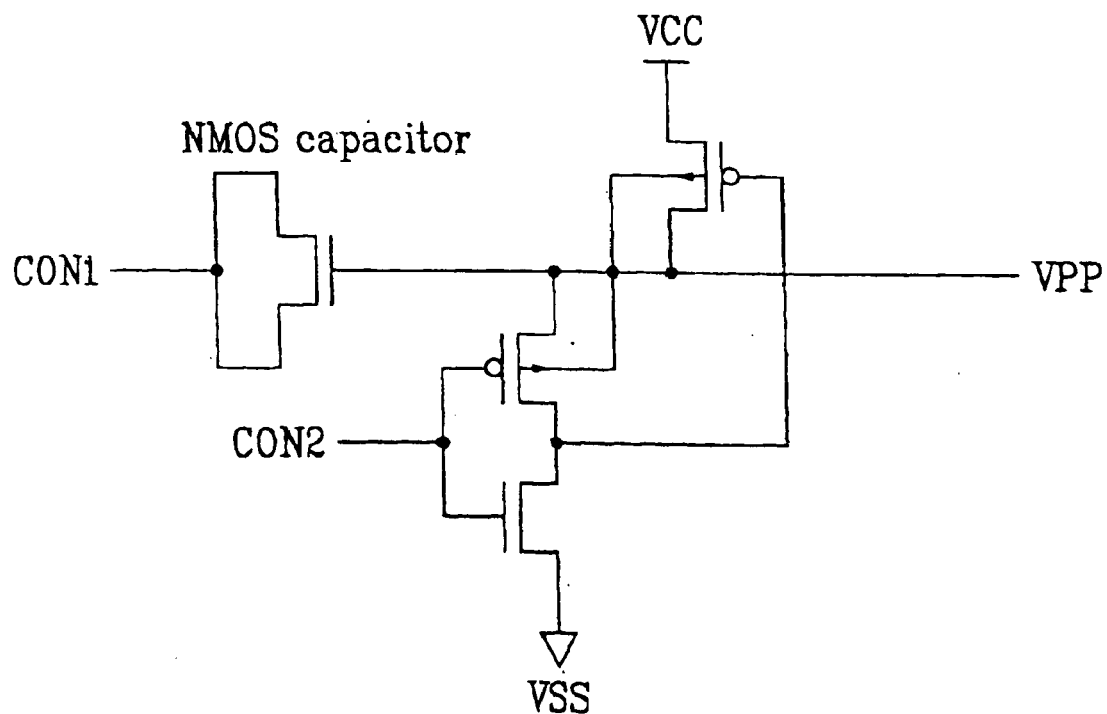
FIG. 12 illustrates a circuit and a timing diagram showing a VPP generation principle in a hierarchal bitline configuration.
Figure 12:
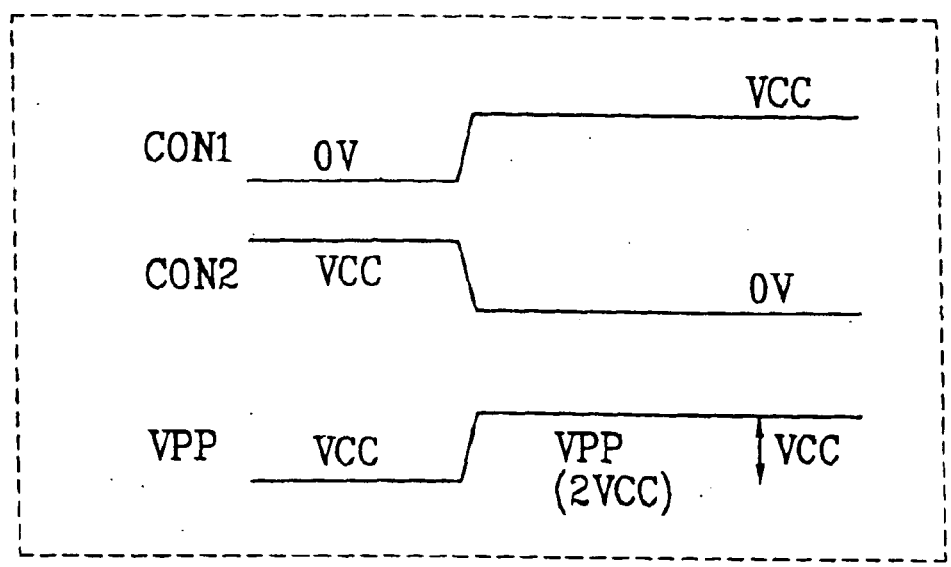
Figure 13:
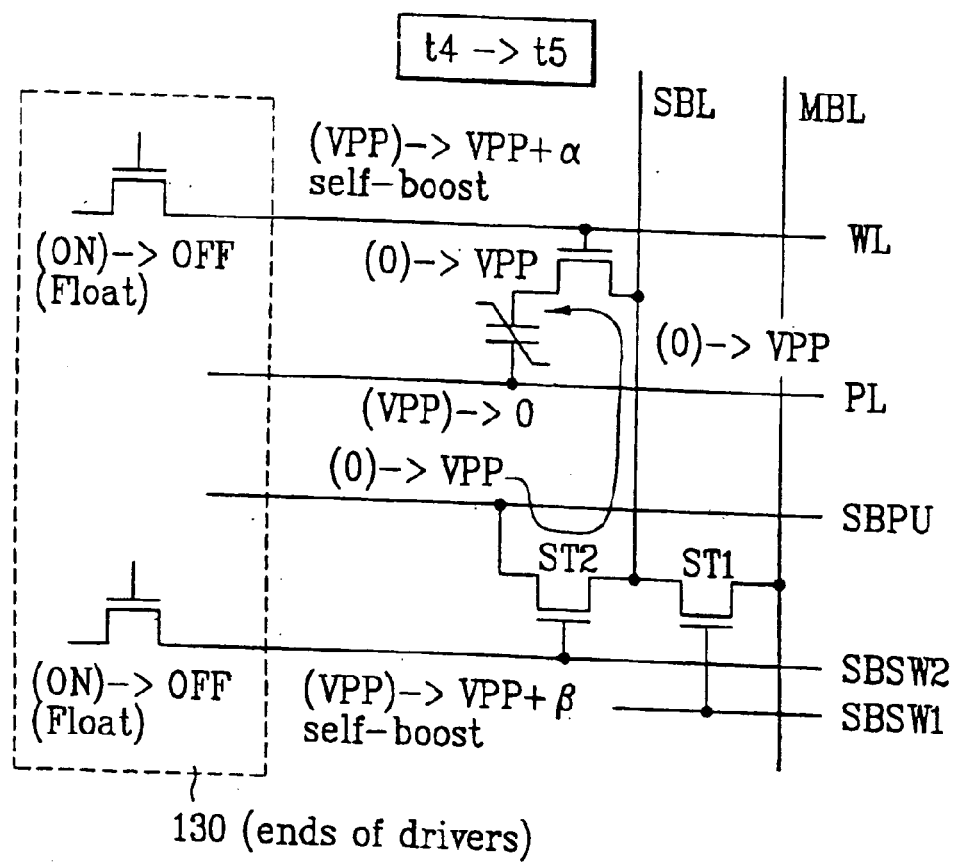
FIG. 13 illustrates a circuit showing a self boost operation in a hierarchal bitline configuration.

The self boost operation carried out for providing VPP to the ferroelectric capacitor in the cell is shown in circuits in FIGS. 12 and 13. FIG. 12 illustrates a circuit and a timing diagram for generating the VPP in response to first, and second control signals CON1, and CON2.

Referring to FIG. 12, the circuit includes an NMOS capacitor having a gate input terminal for receiving the CON 1 signal, a CMOS transistor between the gate input terminal of the NMOS capacitor and a ground voltage terminal VSS for receiving the CON2 signal, and a PMOS transistor between the power source terminal VCC and an output terminal for receiving a signal of an output terminal of the CMOS transistor to determine an output signal. In the operation of FIG. 12, when the CON1 is 0V and the CON2 is VCC, the output terminal outputs VPP, and CON1 is VCC and the CON2 is 0V, the output terminal outputs VPP, wherein VPP is 2VCC.

The foregoing principle may be applied to an operation for storing VPP in the ferroelectric capacitor of the cell.

Referring to FIG. 13, when the SBPU application line and the SBL are at 0V and the SBSW2 application line is at VPP, if VPP is applied to the SBPU, the SBSW2 is self boosted to 2VPP. If the SBSW 2 is self boosted to 2VPP, VPP is provided to the SBL through the second switch transistor ST2.

When the plateline P/L is at VPP, the SBL is at 0V, and the wordline W/L is at VPP, the wordline W/L is self boosted to 2VPP (VPP+α) if the plateline P/L is transited to 0V, and the SBL is transited to VPP. There are first and second switch devices of NMOS transistors at ends 130 of drivers for controlling signals to the SBSW2 application line and the wordline W/L, wherein the first and the second switch devices are turned on at a time before the self boost operation starts, and turned off at a time the self boost operation starts. The foregoing self boost operation stores VPP in the ferroelectric capacitor through the cell transistor.

In formation of the sub bitlines SBL, the main bitlines MBL, and the ferroelectric memory cells in the nonvolatile ferroelectric cell array, all the SBL and the MBL are arranged below the ferroelectric capacitor.

Figure 14A:
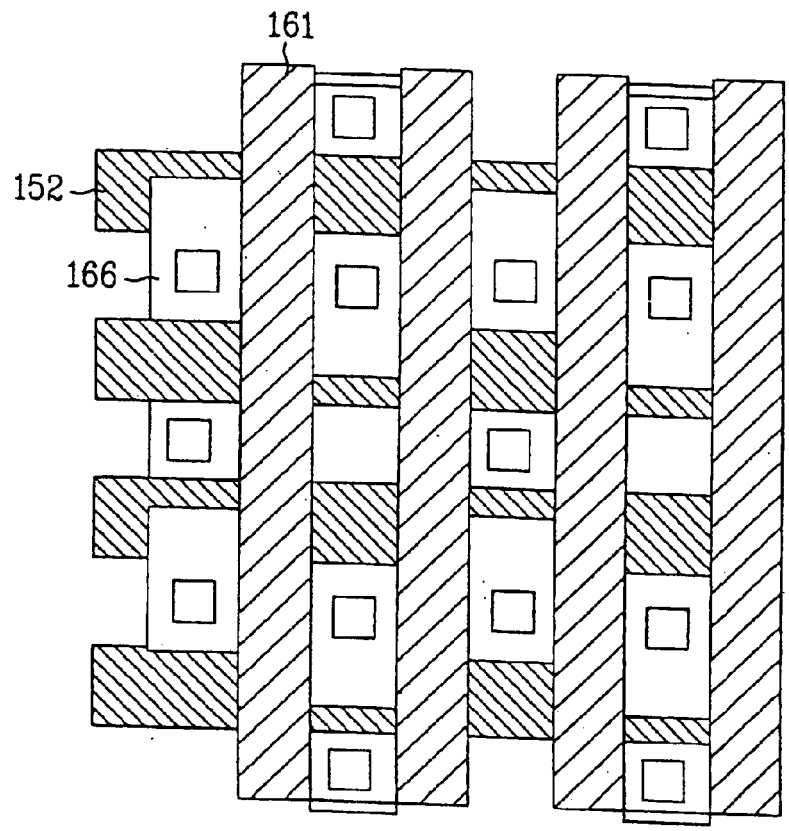
FIG. 14A illustrates a nonvolatile ferroelectric memory array of the present invention.

A system of the foregoing cell having the SBL, the MBL, and the ferroelectric capacitor, and a method for fabricating the same will be explained in reference to FIGS. 14A and 14B. FIG. 14A illustrates a nonvolatile ferroelectric memory array of the present invention and FIG. 14B illustrates a section of a unit cell structure of a nonvolatile ferroelectric memory array of the present invention.

Figure 14B:
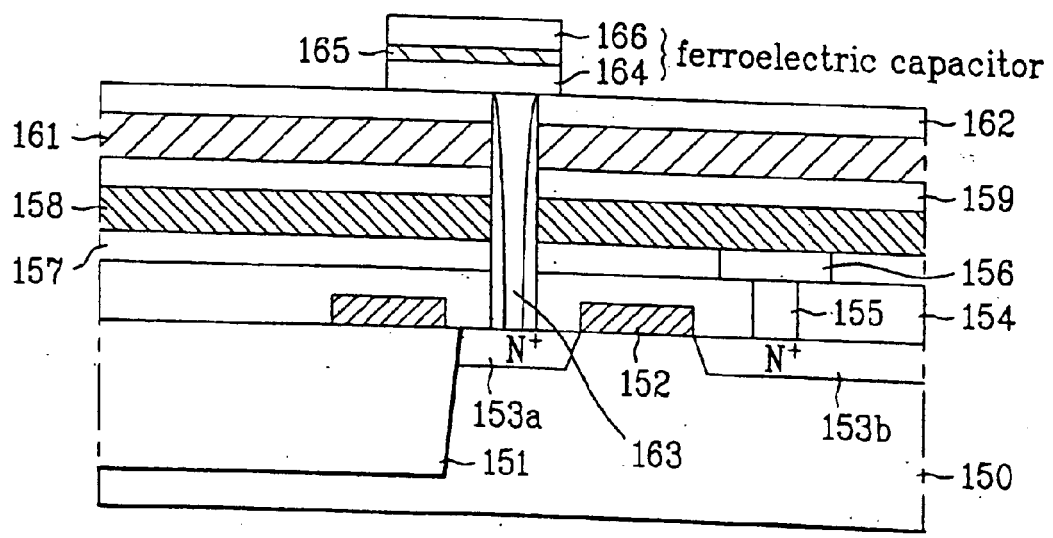
FIG. 14B illustrates a section of a unit cell structure of a nonvolatile ferroelectric memory array of the present invention.

Referring to FIGS. 14A and 14B, there is a field insulating film 151 in a field region, and a wordline W/L 152 in one direction crossing an active region, of a silicon substrate 150 having the active region and the field region defined thereon. Though not shown, there is a gate insulating film under the wordline W/L 152.

There are a source 153a and a drain 153b in the active region on both sides of the wordline W/L 152, a first interlayer insulating film 154 having a first contact hole to the drain 153b, and a first contact plug 155 in the first contact hole. There is a contact pad 156 on the first interlayer insulating film 154, in contact with the first contact plug 155 with a width greater than the first contact plug 155.

There is a second interlayer insulating film 157 on the first interlayer insulating film 154, to expose the contact pad 156, and a sub bitline 158 in contact with the contact pad 156 in a perpendicular direction to the wordline W/L 152. There is a third interlayer insulating film 159 deposited on the sub bitline 158, and a main bitline 161 in a parallel direction with the sub bitline 158 over the sub bitline 158.

There is a barrier insulating film 162 on the main bitline 161, and a contact hole formed by etching the barrier insulating film 162, the main bitline 161, the third interlayer insulating film 159, the sub bitline 158, and the second, and first interlayer insulating films 157 and 154 in succession to expose the source on one side of the wordline W/L 152.

There is a third contact plug 163 in the contact hole, and there are a capacitor lower electrode 164, a ferroelectric film 165, and a capacitor upper electrode 166 on the barrier insulating film 162 in contact with, and adjoining to the third contact plug 163.

Thus, by arranging all the sub bitline SBL 158 and the main bitline MBL 161 below the ferroelectric capacitor, overall bitline capacitance, and coupling noise can be reduced.

A method for fabricating a nonvolatile ferroelectric memory will be explained in reference to FIGS. 15A~15F, and 16A~16G. FIGS. 15A~15F illustrate plan views showing the steps of a method for fabricating the array in FIG. 14A and FIGS. 16A~16G illustrate sections showing the steps of a method for fabricating the structure in FIG. 14B.

Figure 15A:
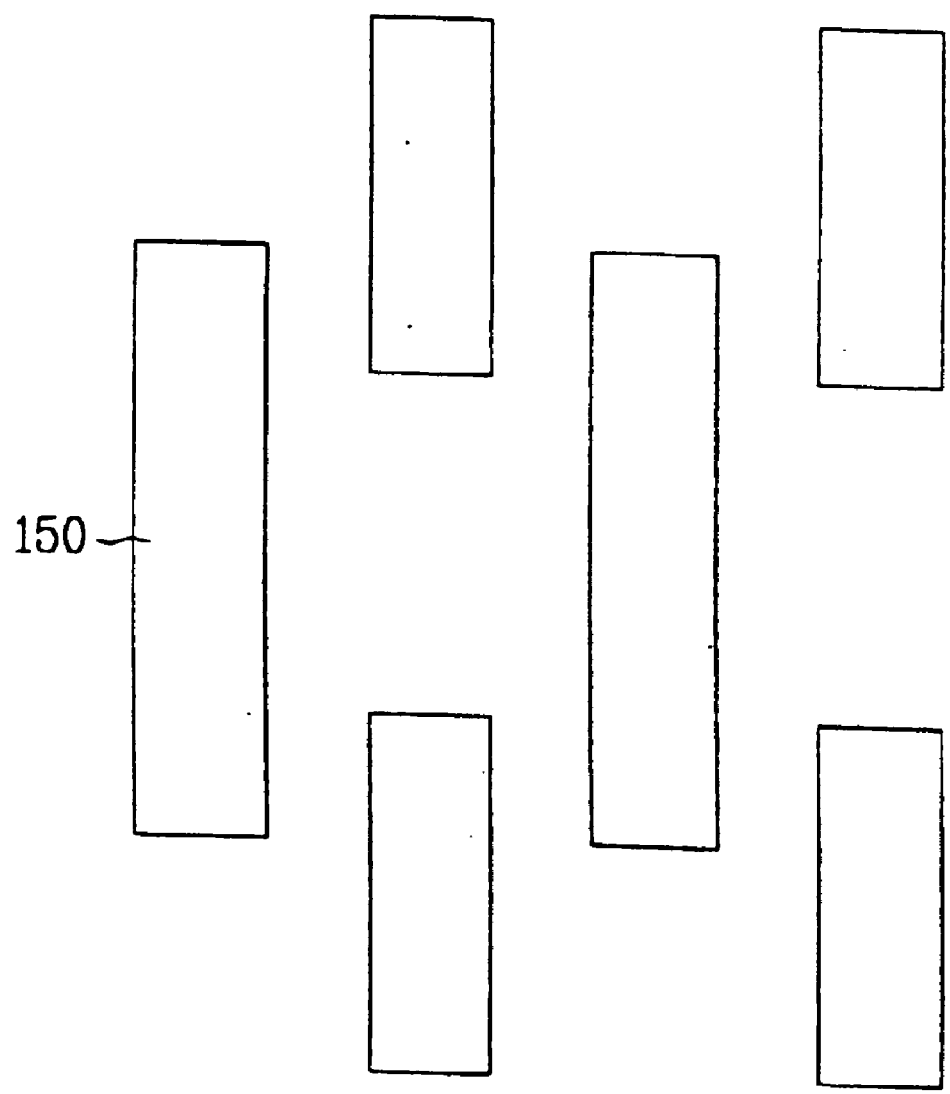
FIGS. 15A–15F illustrate plan views showing the steps of a method for fabricating the array in FIG. 14A.
Figure 16A:
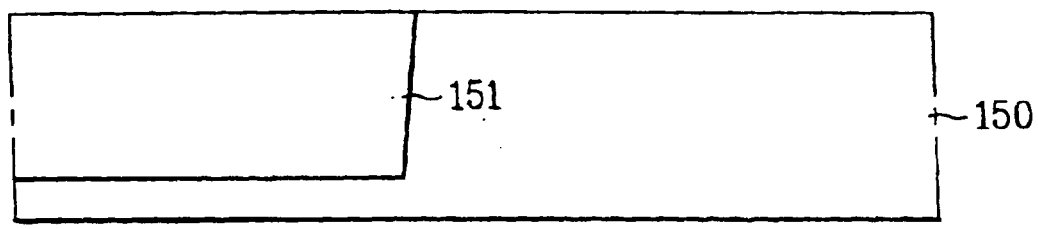
FIGS. 16A–16G illustrate sections showing the steps of a method for fabricating the structure in FIG. 14B.

Referring to FIGS. 15A and 16A, after a trench is formed in a field region of a P type silicon substrate 150 including an active region and a field region defined thereon, a field insulating film 151 of an insulating material, such as oxide or nitride, is formed. The active regions, NMOS transistors are to be formed therein later, have forms of "1" as shown in FIG. 15A.

Figure 15B:
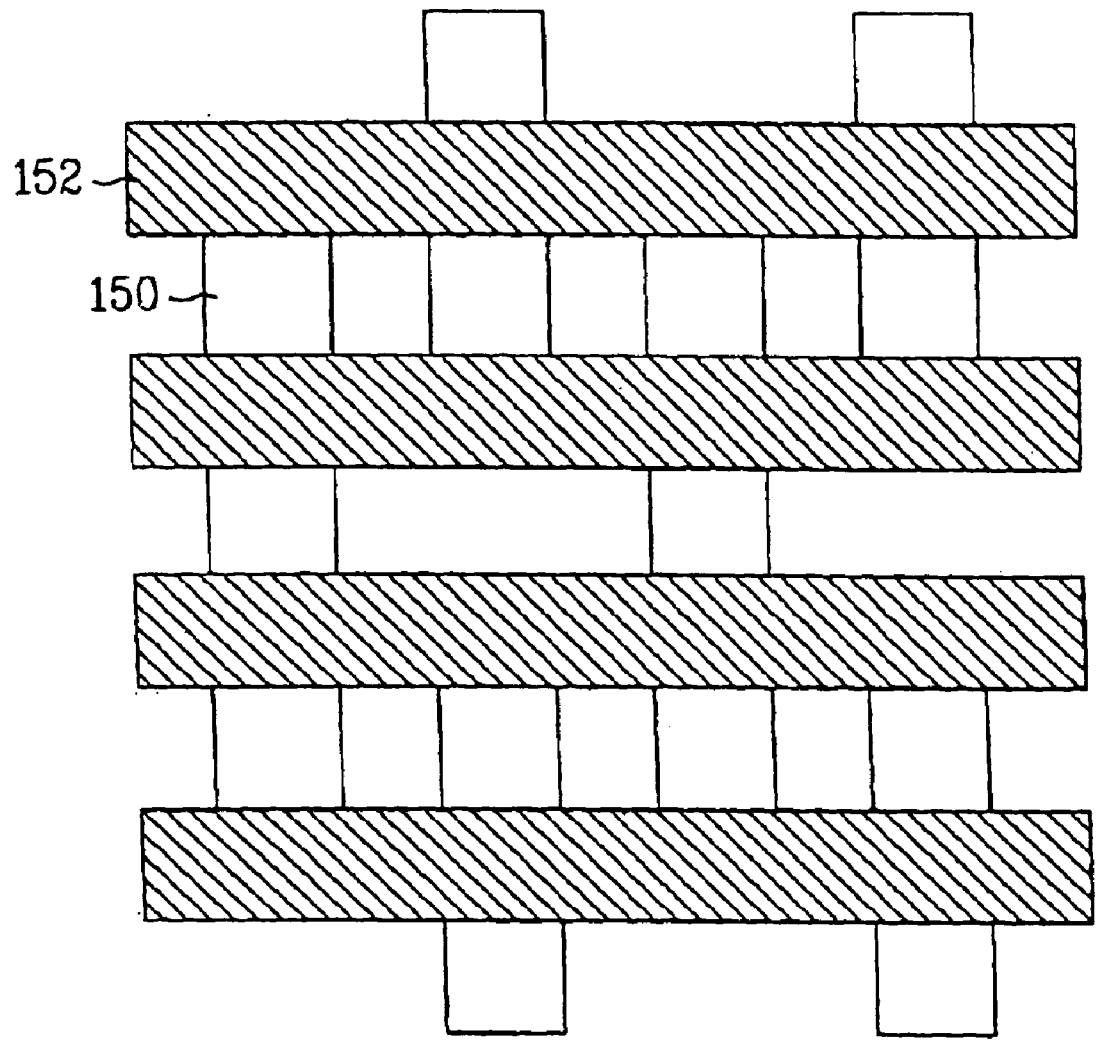
Figure 16B:
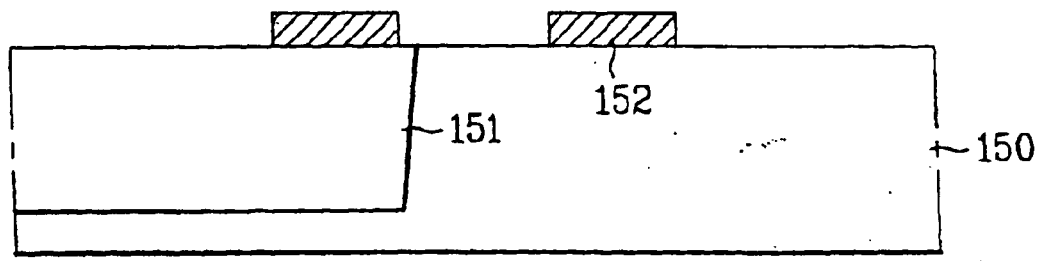

Referring to FIGS. 15B and 16B, a wordline 152 is formed on the substrate 150 in a perpendicular direction to the active regions. Though not shown in the drawing, a gate insulating film is formed under the wordline 152.

Figure 15C:
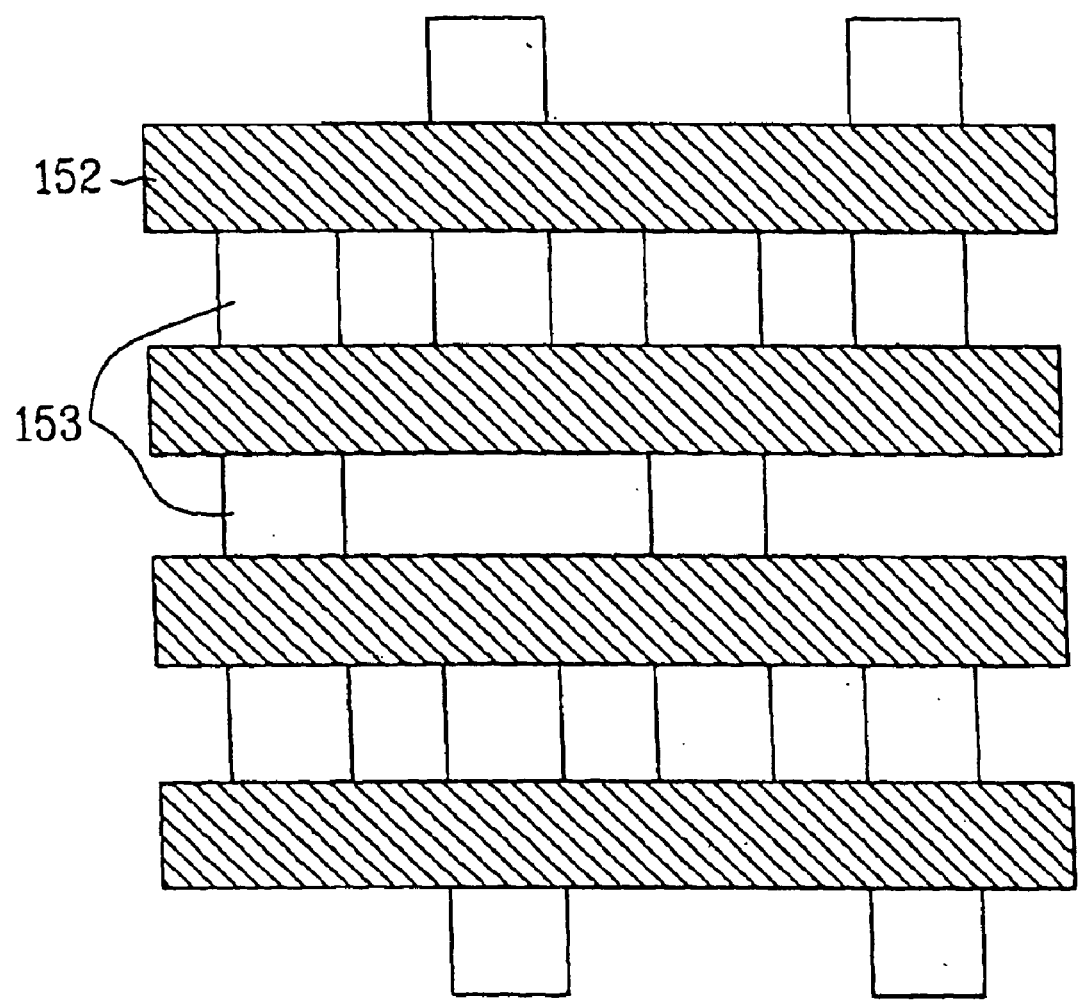
Figure 16C:
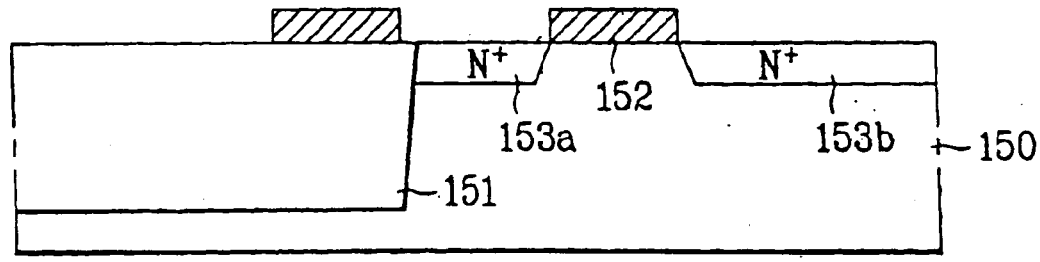

Referring to FIGS. 15C and 16C, N type impurities are injected into a surface of the active region on both sides of the wordline 152 heavily, to form a source 153a and a drain 153b.

Figure 15D:
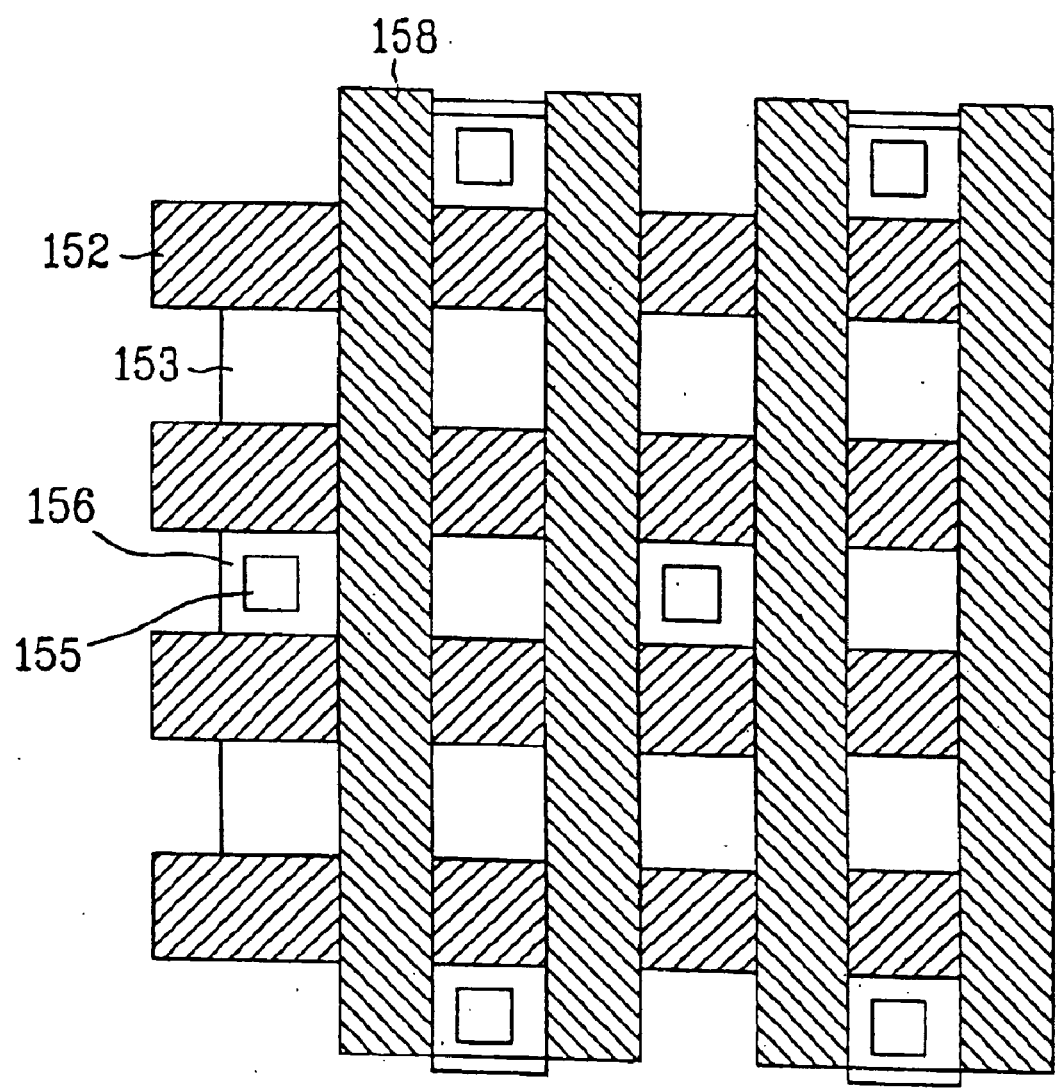
Figure 15E:
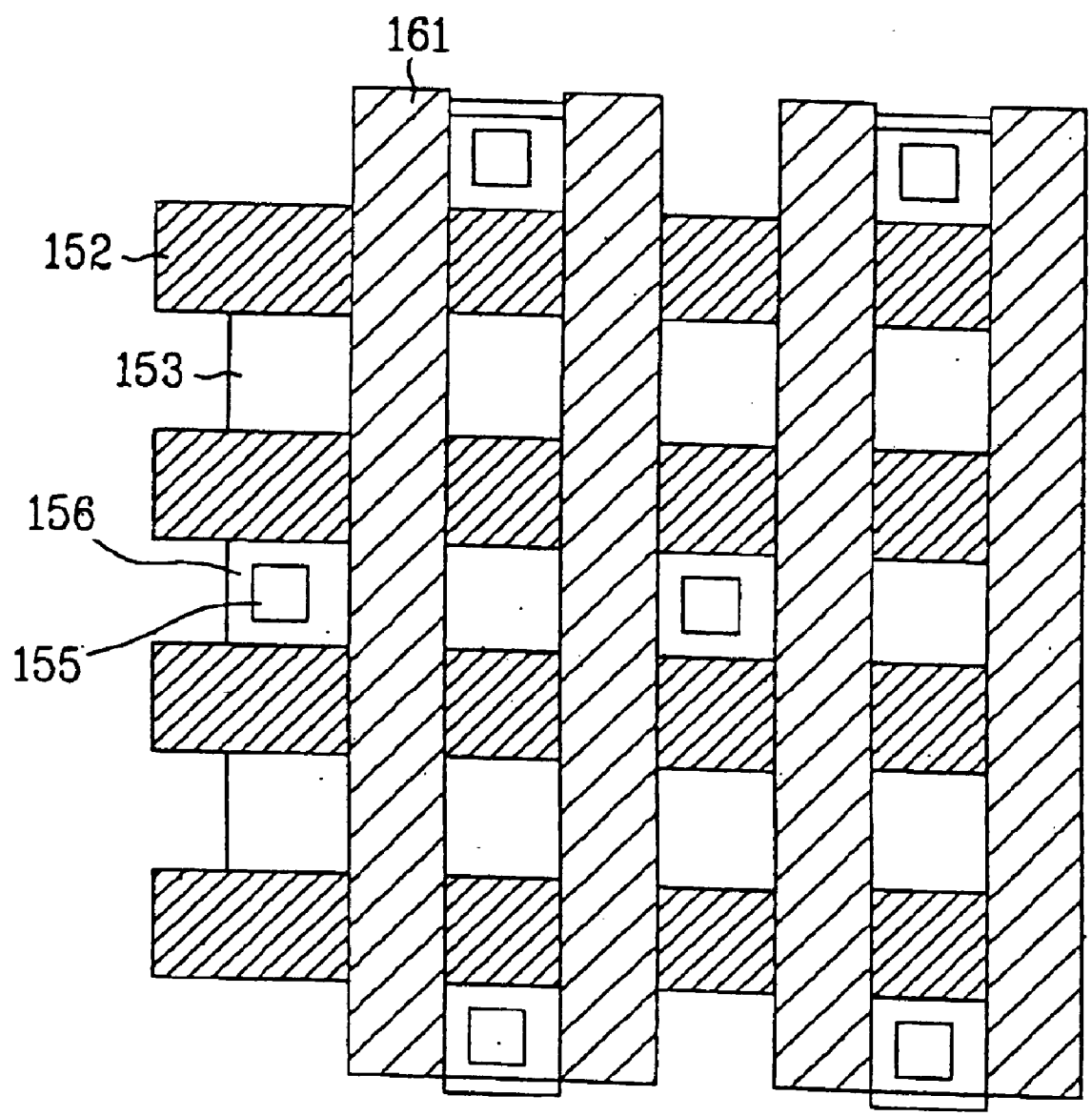
Figure 16D:
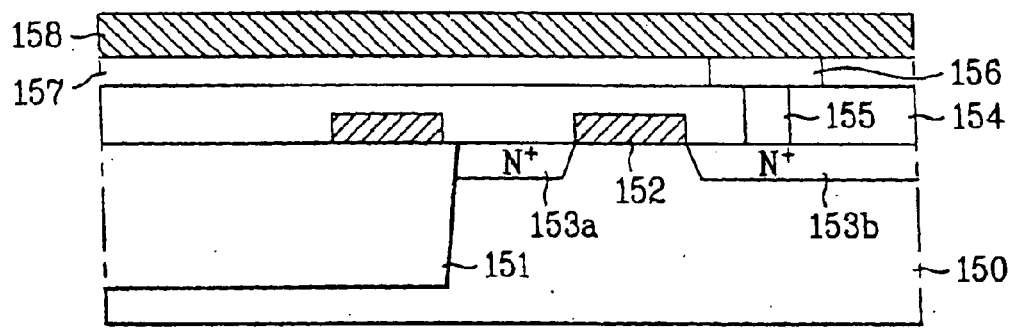
Figure 16E:
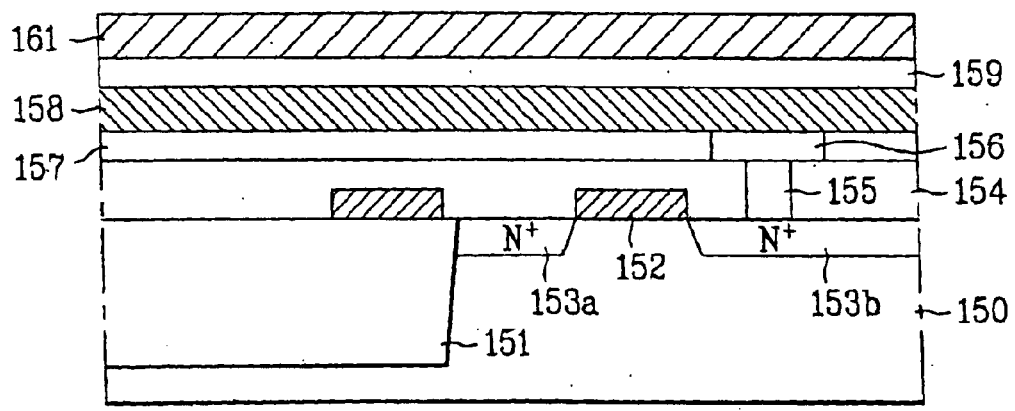

Referring to FIGS. 15D and 16D, after a first interlayer insulating film 154 is deposited on an entire surface including the wordline 152, a contact hole is formed to the drain 153b for forming a sub bitline SBL, a first contact plug 155 is formed in the contact hole, a conductive material is deposited on an entire surface including the first contact plug 155, and patterned so as to be in contact with the first contact plug 155, to form a contact pad 156. Then, after a second interlayer insulating film 157 is deposited on an entire surface, and polished until the contact pad 156 is exposed, and a sub bitline 158 is formed on the second interlayer insulating film 157 in a perpendicular direction to the wordline 152 so as to be in contact with the contact pad 156.

Then, a main bitline MBL is formed, when only the main bitline MBL is formed in a cell region, while both a main bitline contact hole, and the main bitline MBL are formed in a peripheral region. That is, referring to FIGS. 15E and 16E, after a third interlayer insulating film 159 is formed on an entire surface inclusive of the sub bitline 156, a conductive material is deposited on the third interlayer insulating film 159, and the main bitline 161 is formed thereon in a parallel direction with the sub bitline 158.

Figure 16F:
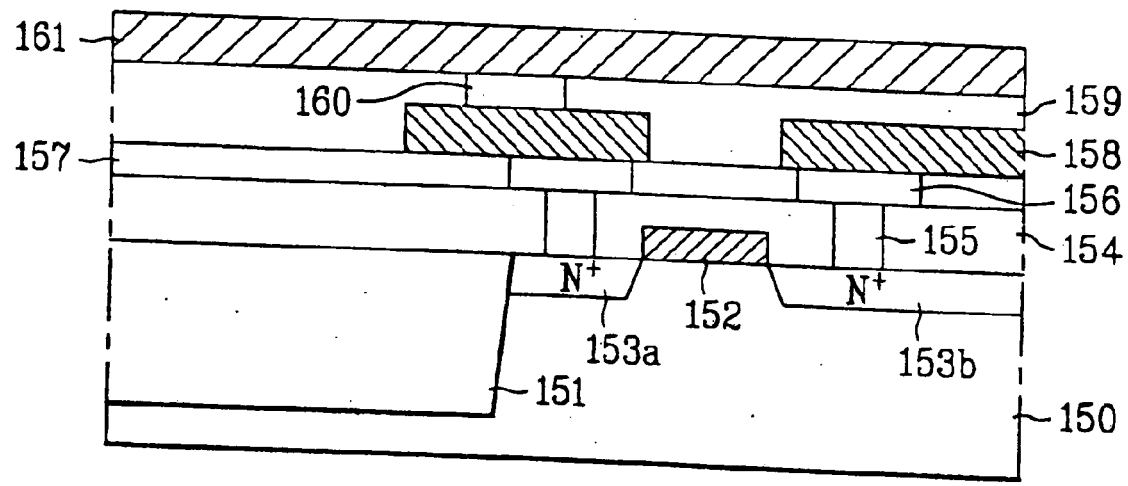

Referring to FIG. 16F, on the other hand, a sub bitline first contact plug 155 is formed to the source 153a and the drain 153b respectively in the peripheral region, and a contact pad 156 is formed so as to be in contact with the first contact plug 155 and to have a width larger than the first contact plug 155. The sub bitline 158 is formed so as to be in contact with the contact pad 156. Then, a main bitline contact hole is formed on the sub bitline 158 connected to the source 153a, and a main bitline second contact plug 160 of a conductive material is formed in the main bitline contact hole. Next, the main bitline 161 is formed on the third interlayer insulating film 159 over the sub bitline 158 in a parallel direction with the sub bitline 158.

Figure 15F:
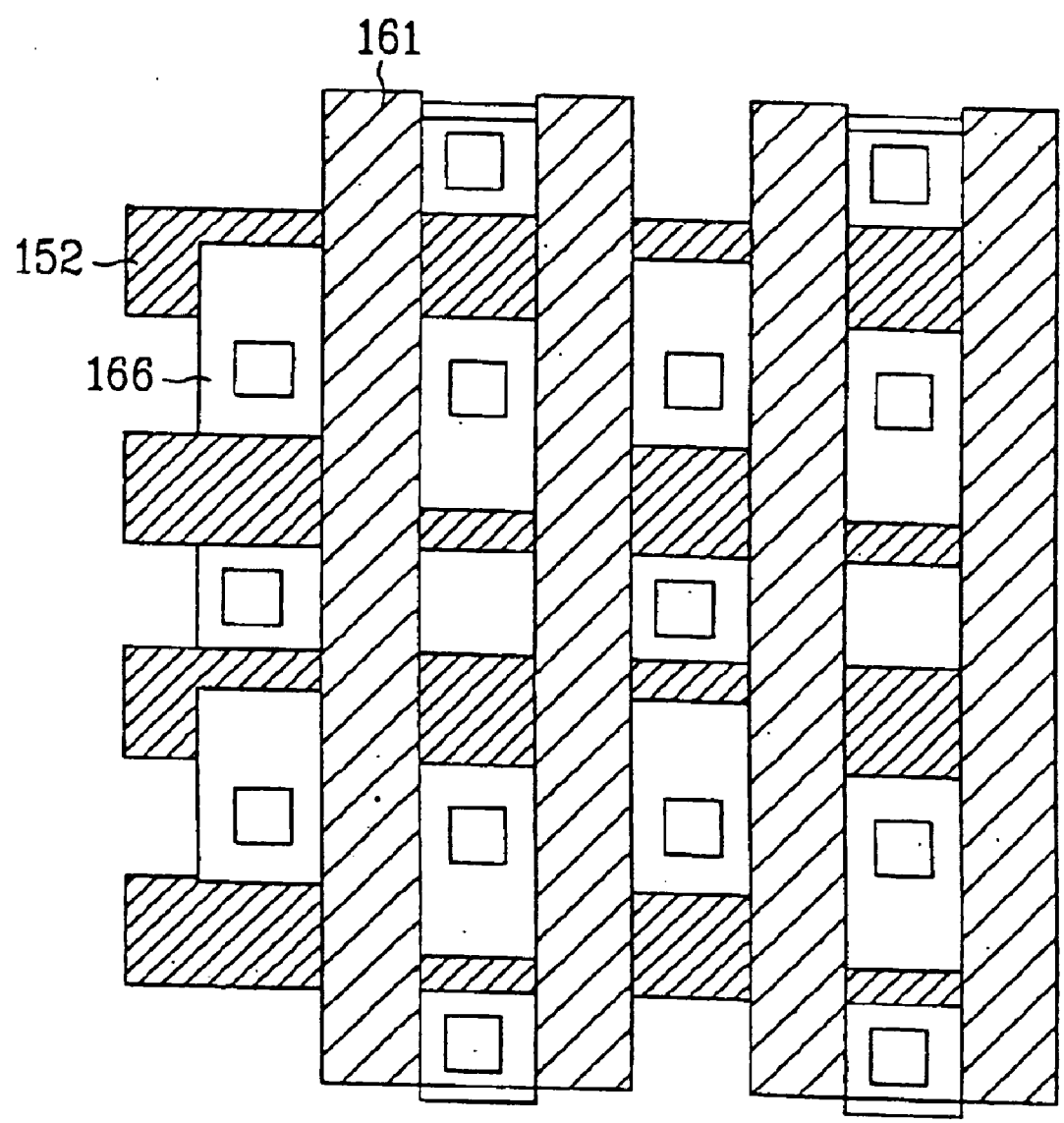
Figure 16G:
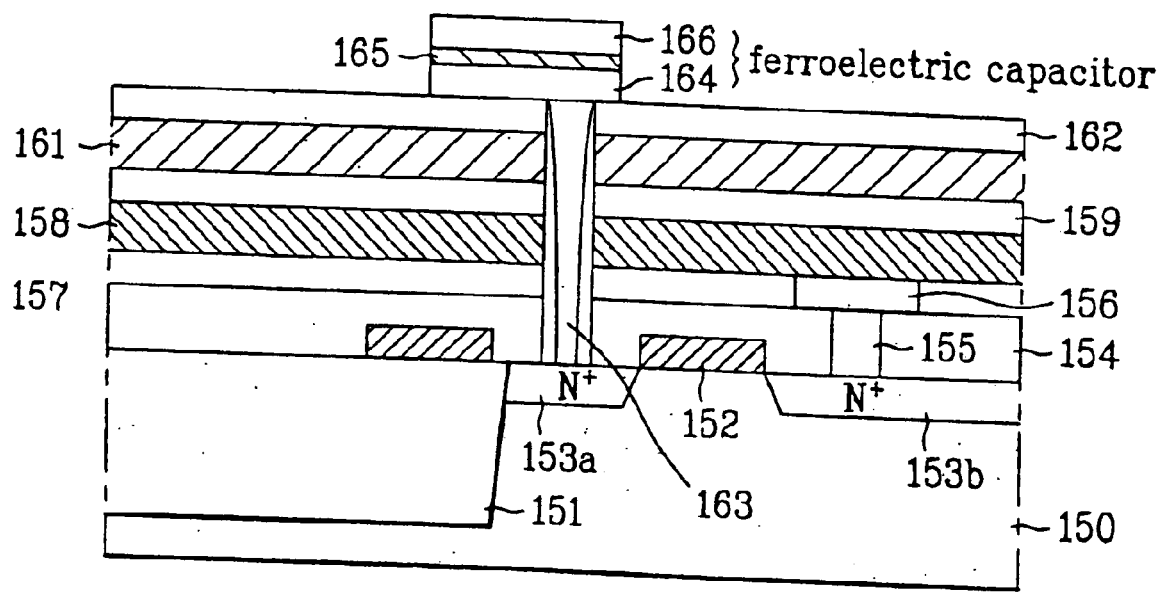

Then, referring to FIGS. 15F and 16G, a barrier insulating film 162 is deposited on the main bitline 161, and the barrier insulating film 162, the main bitline 161, the third interlayer insulating film 159, the sub bitline 158, and the second and first interlayer insulating films 157 and 154 are etched in succession until the source 153a is exposed, to form a capacitor plug forming contact hole. Then, a third contact plug 163 is formed in the contact hole, a first conductive layer, a ferroelectric layer, and a second conductive layer are deposited in succession on the barrier insulating film 162 so as to be in contact with the third contact plug 163, and patterned to form a capacitor lower electrode 164, a ferroelectric film 165 and a capacitor upper electrode 165. In this instance, sidewall spacers of an insulating material are formed at sides of the contact hole before the third contact plug 163 is formed.

Thus, according to the foregoing process, both the main bitline 161 and the sub bitline 158 are formed under the ferroelectric capacitor.

As above-explained, the nonvolatile ferroelectric memory of the present invention has the following advantages.

First, provision of one sub bitline per one main bitline allows the reduction of a bitline capacitance, and thereby improves a chip operation speed.

Second, a cell operable at a low voltage can be realized by using SBSW1, and SBSW2 which are switch signals, SBPU which controls self boost operation, and SBPD which controls a pull down operation.

A pre-charge time period can be reduced by writing either logic "1" or logic "0" data in the active period.

Fourth, the formation of the sub bitline and the main bitline below the ferroelectric capacitor allows the reduction of a total bitline capacitance and coupling noise.

It will be apparent to those skilled in the art that various modifications and variations can be made in the nonvolatile ferroelectric memory, and the method for driving the same of the present invention without departing from the spirit or scope of the invention. Thus, it is intended that the present invention cover the modifications and variations of this invention provided they come within the scope of the appended claims and their equivalents.

What is claimed is:

1. A nonvolatile ferroelectric memory comprising:
    a top cell array block and a bottom cell array block, each array block having sub cell array blocks, each sub cell array block having a plurality of unit cells;
    a plurality of main bitlines arranged in one direction in correspondence to a column unit of the sub cell array blocks;
    a plurality of sub bitlines each connected to one terminal of one of the plurality of unit cells arranged in a same direction as said one direction of the main bitlines;
    a sense amplifier block having sense amplifiers between the top cell array block and the bottom cell array block, each sense amplifier for amplifying a signal from the main bitline;
    sub bitline first switch signal application lines and sub bitline second switch signal application lines for controlling connection of the sub bitlines and the main bitlines, sub bitline pull up signal application lines for controlling pull up of the sub bitlines by a self boost operation, and sub bitline pull down signal application lines for selective pull down of the sub bitlines, which are arranged perpendicular to the sub bitlines in correspondence to the sub cell array blocks;
    a first switch device in each sub cell array block in correspondence to a column direction for operation under control of the sub bitline first switch signal application line;
    a second switch device in each sub cell array block in correspondence to a column direction for selective transfer of a signal from the sub bitline pull up signal application line to the sub bitline under the control of the sub line second switch signal application line; and,
    a third switch device in each sub cell array block in correspondence to a column direction for selective pull down of the sub bitline under control of the sub bitline pull down application line.

2. The nonvolatile ferroelectric memory as claimed in claim 1, wherein the first switch device has a gate connected to the sub bitline first switch signal application line, and two electrodes both connected to the main bitline and the sub bitline, respectively.

3. The nonvolatile ferroelectric memory as claimed in claim 1, wherein the second switch device has a gate connected to the sub bitline second switch signal application line, and two electrodes both connected to the sub bitline pull up line and the sub bitline, respectively.

4. The nonvolatile ferroelectric memory as claimed in claim 1, wherein the third switch device has a gate connected to the sub bitline pull down application line, and two electrodes both connected to a ground voltage terminal and the sub bitline, respectively.

5. The nonvolatile ferroelectric memory as claimed in claim 1, wherein each of the sub cell array blocks includes a hierarchal folded bitline cell array in which no cells overlap when the cell array is folded centered on the main bitline.

6. The nonvolatile ferroelectric memory as claimed in claim 1, wherein each of the sub cell array blocks includes a hierarchal open bitline cell array in which cells overlap when the cell array is folded centered on the main bitline.

7. The nonvolatile ferroelectric memory as claimed in claim 1, wherein one sense amplifier in the sense amplifier block is provided for every two main bitlines.

8. The nonvolatile ferroelectric memory as claimed in claim 1, wherein one sense amplifier in the sense amplifier block is provided for each main bitline.

9. The nonvolatile ferroelectric memory as claimed in claim 1, wherein each unit cell includes:
    the sub bitline arranged in a first direction,
    a wordline arranged in a second direction perpendicular to the first direction of the sub bitline,
    a plateline spaced from the wordline, and in the second direction,
    a transistor having a gate connected to the wordline, a source connected to the sub bitline, and
    a ferroelectric capacitor having a first terminal connected to a drain of the transistor, and a second terminal connected to the plateline.

10. The nonvolatile ferroelectric memory as claimed in claim 1, further comprising a wordline driver shared between the sub cell array blocks for driving the wordline.

11. The nonvolatile ferroelectric memory as claimed in claim 1, wherein the ferroelectric capacitor in the unit cell is arranged below the sub bitline and the main bitline.

12. The nonvolatile ferroelectric memory as claimed in claim 5, wherein a cell in a row is arranged at every two columns, and a cell in a column is also arranged at every two rows in the hierarchal folded bitline cell array.

13. The nonvolatile ferroelectric memory as claimed in claim 6, wherein a cell in a row, and a cell in a column are arranged at every one column and row in the hierarchal open bitline cell array.

14. A method for driving a nonvolatile ferroelectric memory, in which a sub bitline is enabled, and pulled up/pulled down by a self boost operation, the sub bitline being selected by a sub bitline first switching signal application line, a sub bitline second switching signal application line, a sub bitline pull up signal application line, and a sub bitline pull down signal application line, and when a continuous active period is divided into t1, t2, t3, t4, and t5 sections, and a pre-charge period is divided into t0, and t6 sections, the method comprising the steps of:
    (a) applying a first high level voltage to the sub bitline pull down signal application line in the t0 section, for pulling down a sub bitline and a main bitline to a low level;
    (b) applying a low level voltage to the sub bitline pull down signal application line in the t1 section;
    (c) applying a second high level voltage higher than the first high level voltage to a wordline in the t2, t3, and t4 sections, and to a plateline in the t2, and t3 sections, and applying the first high level voltage to the sub bitline first switch signal application line in the t2, and t3 sections, for transferring cell data to the sense amplifier through the sub bitline and the main bitline;

(d) applying the second high level voltage to the sub bitline second switch signal application line, and transiting the plateline to the low level, both in the t4 section, and applying the second high level voltage to the sub bitline second switch signal application line in the t5 section, for self boosting the sub bitline second switch signal application line and the word line to a third high level voltage higher than the second high level voltage, thereby writing logic "1" data on a ferroelectric capacitor; and, (e) transiting the wordline and the plateline to the second high level, and applying the first high level voltage to the sub bitline first switch application line, both in the t6 section, for writing logic "0" data in the ferroelectric capacitor.

15. The method as claimed in claim 14, wherein the second high level voltage is two times higher than the first high level voltage.

16. The method as claimed in claim 14, wherein the self boosted third high level voltage is two times higher than the second high level voltage.

17. The nonvolatile ferroelectric memory as claimed in claim 9, wherein the ferroelectric capacitor in the unit cell is arranged below the sub bitline and the main bitline.

* * * * *